(12) United States Patent
Uchida

(10) Patent No.: US 12,167,597 B2
(45) Date of Patent: Dec. 10, 2024

(54) SEMICONDUCTOR DEVICE

(71) Applicant: Kioxia Corporation, Tokyo (JP)

(72) Inventor: Keisuke Uchida, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 467 days.

(21) Appl. No.: 17/643,632

(22) Filed: Dec. 10, 2021

(65) Prior Publication Data

US 2023/0053334 A1   Feb. 23, 2023

(30) Foreign Application Priority Data

Aug. 17, 2021   (JP) .................................. 2021-132917

(51) Int. Cl.
*H10B 43/27* (2023.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35
See application file for complete search history.

(56) References Cited

U.S. PATENT DOCUMENTS

| 2018/0019257 | A1* | 1/2018 | Son | ......................... H10B 43/30 |
| 2020/0083248 | A1  | 3/2020 | Uchida | |
| 2022/0123012 | A1* | 4/2022 | Gao | ................... H01L 29/40117 |

FOREIGN PATENT DOCUMENTS

JP   2020-43119 A   3/2020

* cited by examiner

*Primary Examiner* — Joseph C. Nicely
*Assistant Examiner* — Alvin L Lee
(74) *Attorney, Agent, or Firm* — Oblon, McClelland, Maier & Neustadt, L.L.P.

(57) ABSTRACT

A semiconductor device according to an embodiment includes a first conductive layer extending like a plate in a first direction; a second conductive layer extending like a plate in a second direction intersecting the first direction; and a first memory film arranged in such a manner as to be sandwiched between the first conductive layer and the second conductive layer in a third direction intersecting the first direction and the second direction in a region where the first conductive layer and the second conductive layer intersect, wherein a memory cell is configured in an arc shape in the region where the first conductive layer and the second conductive layer intersect using a part of the first conductive layer, a part of the first memory film, and a part of the second conductive layer.

12 Claims, 44 Drawing Sheets

Portion A Cross Section

Portion B Cross Section

Portion C Cross Section

Portion D Cross Section

Portion E Cross Section

Portion F Cross Section

Portion G Cross Section

Portion F Cross Section

Portion F Cross Section

Portion F Cross Section

Portion G Cross Section

Portion G Cross Section

Portion G Cross Section

Portion G Cross Section

Portion F Cross Section

Portion H Cross Section

Portion G Cross Section

Portion G Cross Section

Portion H Cross Section

Portion H Cross Section

Portion G Cross Section

Portion F Cross Section

Portion F Cross Section

Portion I Cross Section

Portion I Cross Section

SEMICONDUCTOR DEVICE

CROSS-REFERENCE TO RELATED APPLICATION

This application is based upon and claims the benefit of priority from Japanese Patent Application No. 2021-132917 filed on Aug. 17, 2021 in Japan, the entire contents of which are incorporated herein by reference.

FIELD

Embodiments described herein relate generally to a semiconductor device.

BACKGROUND

In the development of semiconductor devices, particularly semiconductor storage devices, memory cells have been miniaturized in order to achieve a large capacity, a low cost, and the like. For example, a three-dimensional NAND flash memory device in which memory cells are three-dimensionally arranged has been developed. In the three-dimensional NAND flash memory device, an NAND string in which memory cells are connected in a direction perpendicular to a word line layer face (so-called stacking direction) is formed in word line layers stacked with dielectric layers interposed therebetween. This achieves high integration as compared with a case where memory cells are two-dimensionally arranged.

In the three-dimensional NAND flash memory device, it is required to further increase the degree of integration of cells. The difficulty of the process increases for performing execution in an NAND string structure in which memory cells are connected in a direction perpendicular to a word line layer face.

DETAILED DESCRIPTION

A semiconductor device according to an embodiment includes a first conductive layer, a second conductive layer, and a first memory film. The first conductive layer extends like a plate in a first direction. The second conductive layer extends like a plate in a second direction intersecting the first direction. The first memory film is arranged in such a manner as to be sandwiched between the first conductive layer and the second conductive layer in a third direction intersecting the first direction and the second direction in a region where the first conductive layer and the second conductive layer intersect. A memory cell is configured in an arc shape in the region where the first conductive layer and the second conductive layer intersect using a part of the first conductive layer, a part of the first memory film, and a part of the second conductive layer.

Hereinafter, an embodiment will describe a semiconductor device capable of improving the degree of integration of cells in a three-dimensional memory device.

Examples of the semiconductor device in the following embodiment include a flash memory device, a phase change memory, a resistance change memory device including a conductive bridge RAM (CBRAM), a magnetoresistive memory device, and a ferroelectric memory device. Hereinafter, in the embodiment, a three-dimensional NAND flash memory device will be described as one example of the semiconductor device. Hereinafter, description will be given with reference to the drawings. In each drawing, the x, y, and z directions are orthogonal to each other, the z direction may be described as an upward direction or an upper layer direction, and the opposite direction may be described as a downward direction or a lower layer direction.

First Embodiment

Figure 1:
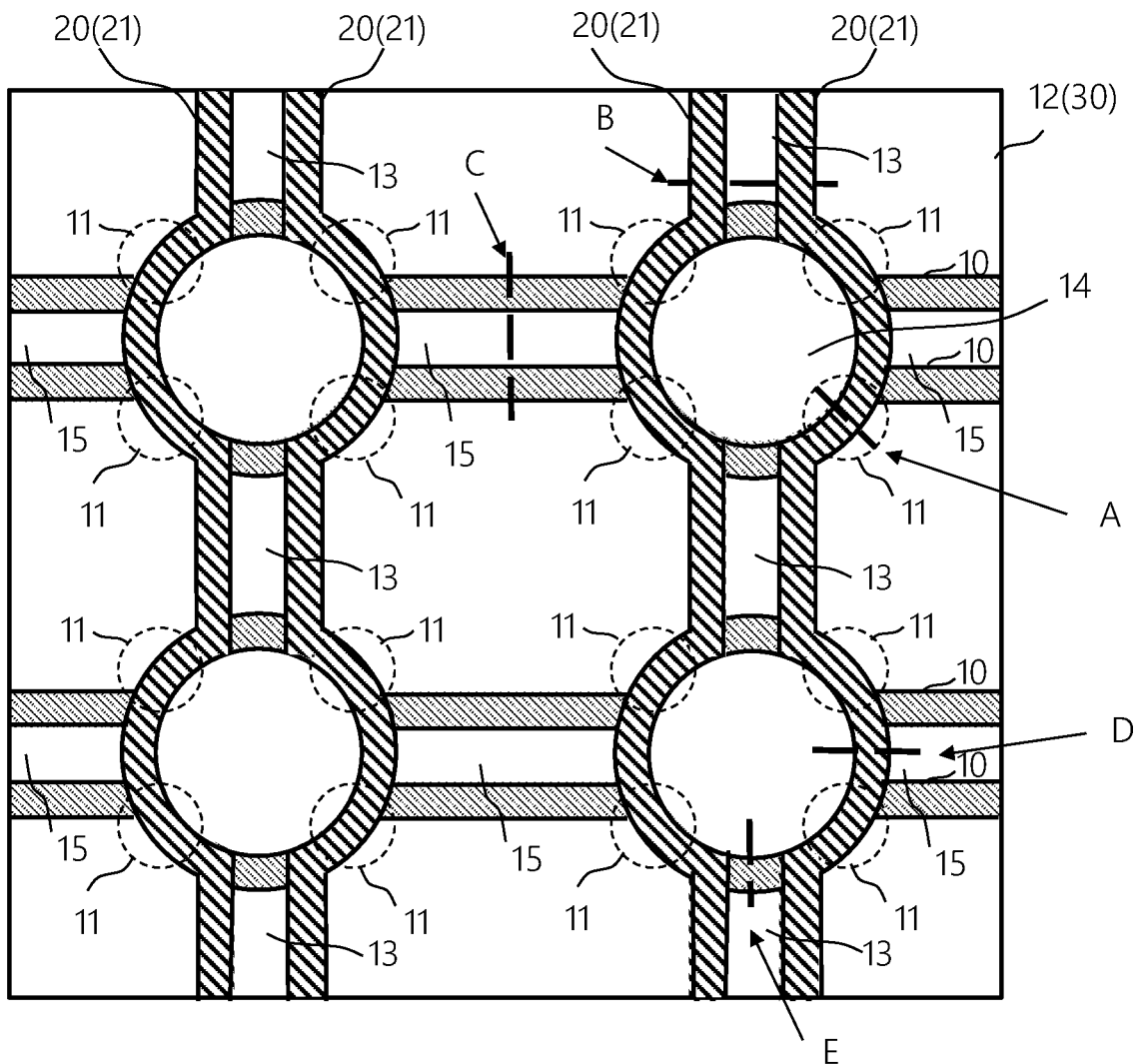
FIG. 1 is a top configuration diagram showing one example of a configuration of a semiconductor device according to a first embodiment.
Figure 2:
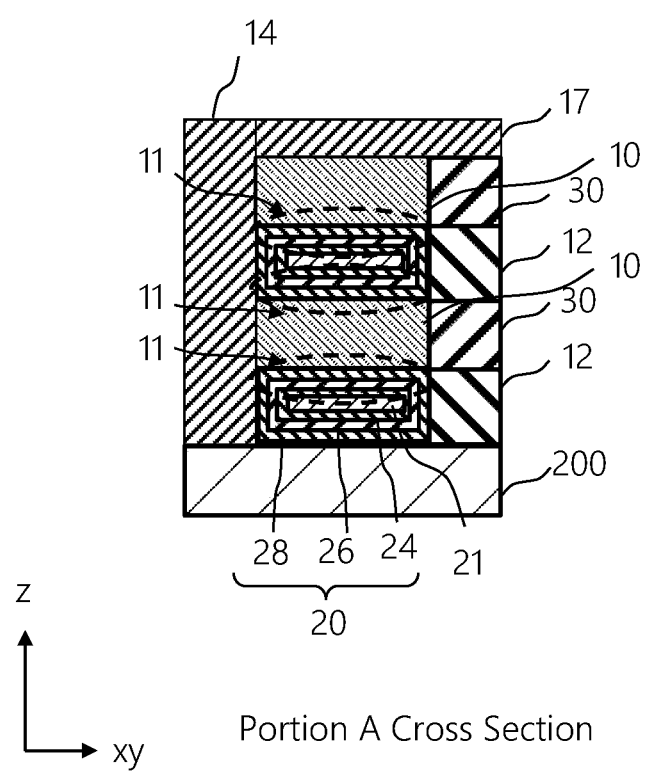
FIG. 2 is a diagram showing one example of a cross-sectional view of a portion A of the semiconductor device according to the first embodiment.
Figure 3:
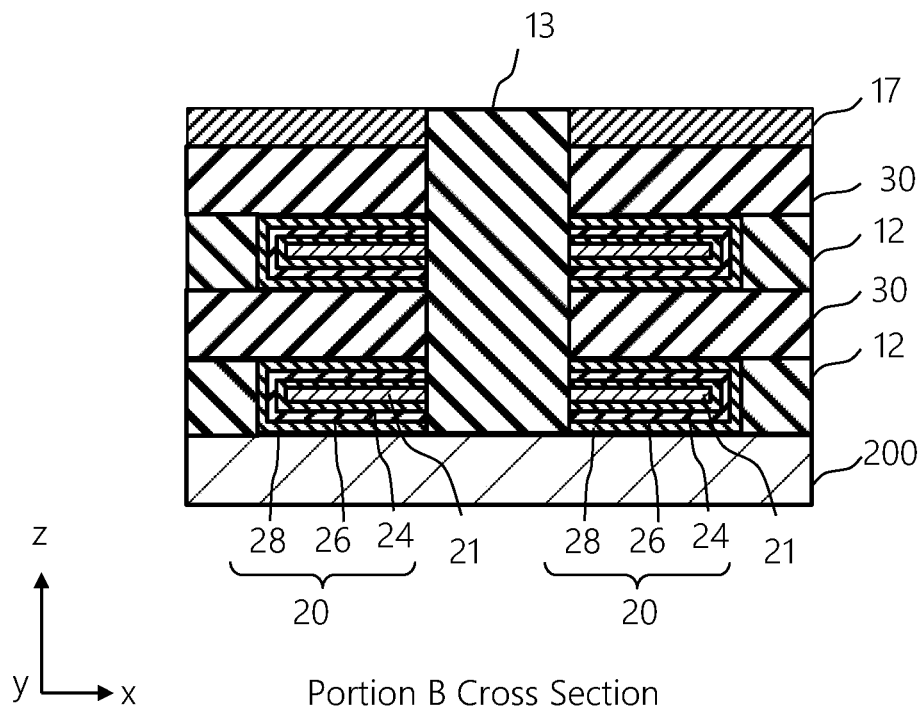
FIG. 3 is a diagram showing one example of a cross-sectional view of a portion B of the semiconductor device according to the first embodiment.
Figure 4:
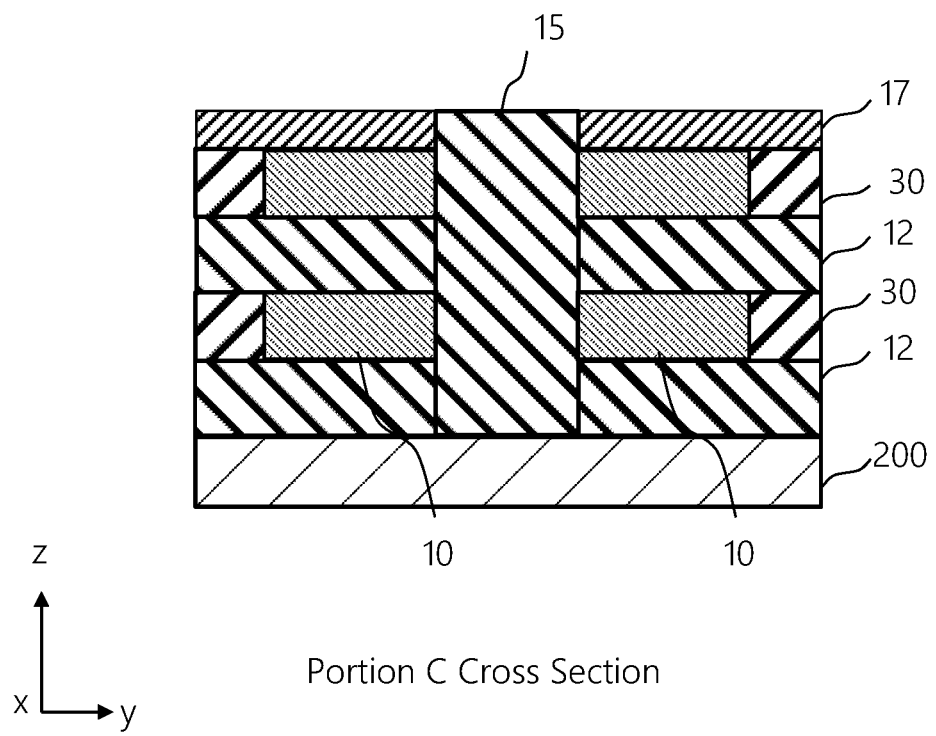
FIG. 4 is a diagram showing one example of a cross-sectional view of a portion C of the semiconductor device according to the first embodiment.
Figure 5:
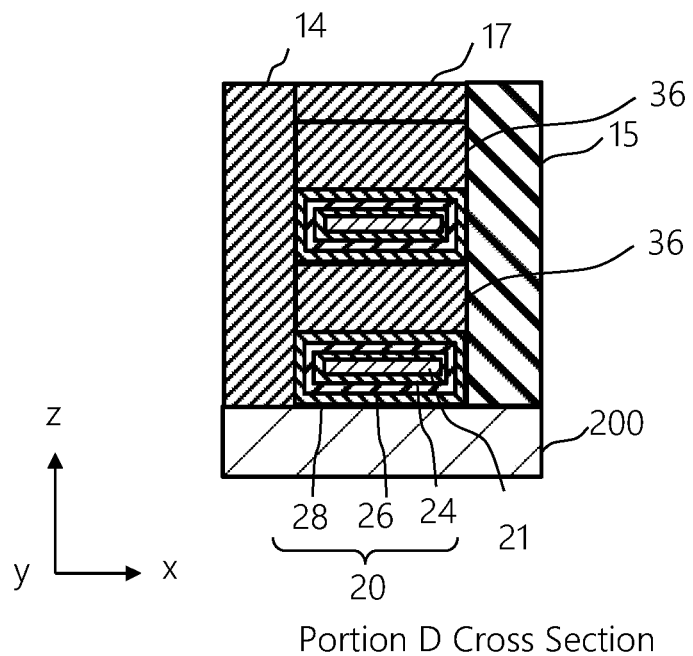
FIG. 5 is a diagram showing one example of a cross-sectional view of a portion D of the semiconductor device according to the first embodiment.
Figure 6:
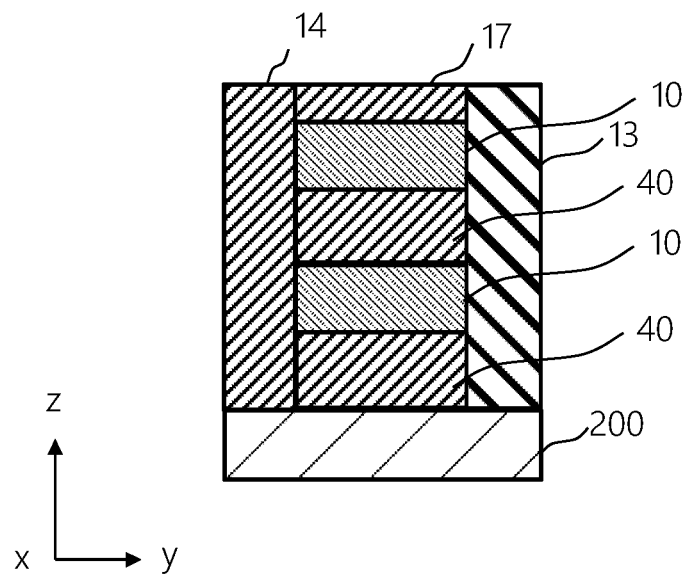
FIG. 6 is a diagram showing one example of a cross-sectional view of a portion E of the semiconductor device according to the first embodiment.

FIG. 1 is a top configuration diagram showing one example of a configuration of a semiconductor device according to a first embodiment. FIG. 2 is a diagram showing one example of a cross-sectional view of a portion A of the semiconductor device according to the first embodiment. FIG. 3 is a diagram showing one example of a cross-sectional view of a portion B of the semiconductor device according to the first embodiment. FIG. 4 is a diagram showing one example of a cross-sectional view of a portion C of the semiconductor device according to the first embodiment. FIG. 5 is a diagram showing one example of a cross-sectional view of a portion D of the semiconductor device according to the first embodiment. FIG. 6 is a diagram showing one example of a cross-sectional view of a portion E of the semiconductor device according to the first embodiment. In FIG. 1, the lower layer side when viewed from above is also shown so that the arrangement configuration of the conductive layer 10 on the upper layer side, the channel layer 21 on the lower layer side, and the memory film 20 can be seen. The scales of FIGS. 1 to 6 are not matched.

In FIGS. 1 to 6, in the semiconductor device according to the first embodiment, a stacked film in which two layers of different film types are alternately stacked is arranged above a semiconductor substrate 200 (substrate). In the example of FIGS. 1 to 6, for example, oxide film layers 12 and nitride film layers 30 are alternately stacked as the stacked film. As the different film types, film types having different etching resistances are used.

In the example of FIGS. 1 to 6, the oxide film layer 12 is first arranged on the semiconductor substrate 200, and the uppermost nitride film layer 30 is covered with a protective film 17. As shown in FIGS. 1 and 4, a plurality of conductive layers 10 (first conductive layers) extending for example like a plate in the x direction (first direction) are arranged in each of the plurality of nitride film layers 30. The plurality of conductive layers 10 formed in a same layer are arranged apart from each other. The plurality of conductive layers 10 arranged apart from each other in the same layer is separated by the nitride film layer 30. The plurality of conductive layers 10 arranged apart from each other in the vertical direction are separated by the oxide film layer 12. Each of the conductive layers 10 functions as a word line (WL) in the semiconductor storage device. A barrier metal film (not shown) such as titanium nitride (TiN) may be preferably arranged between each conductive layer 10 and the periphery.

As shown in FIGS. 1 and 3, a plurality of conductive layers 21 (second conductive layers) for example extending like a plate in the y direction (second direction) orthogonal to the x direction are arranged in each of the plurality of oxide film layers 12. As a material of the conductive layer 21, a conductive material is used. Examples of the conductive material include a semiconductor material such as silicon (Si) in addition to a metal material. The conductive layer 21 functions as a channel layer, for example in a flash memory device. In addition, a memory film 20 is arranged on at least one of the upper face side and the lower face side of each conductive layer 21. In the example of FIG. 1, the memory film 20 is arranged on both the upper face side and the lower face side of each conductive layer 21. In portions A and D shown in FIG. 1, the memory film 20 is arranged in such a manner as to surround the periphery of each conductive layer 21 as shown in FIGS. 2 and 5. In a portion B shown in FIG. 1, the memory film 20 is arranged on the upper face and the lower face of each conductive layer 21, and the memory film 20 is also arranged on one of both side faces of the conductive layer 21 as shown in FIG. 3. As shown in FIG. 3, the memory film 20 is arranged on the side face on the oxide film layer 12 side, of the side faces of each conductive layer 21.

As shown in FIG. 1, each conductive layer 10 and each conductive layer 21 overlap in an arc shape in the z direction in a region where they intersect. In the example of FIG. 1, a columnar body 14 is arranged at the center of a region where two conductive layers 10 forming a pair and two conductive layers 21 forming a pair intersect. As shown in FIGS. 5 and 6, the columnar body 14 extends in the stacking direction of the stacked film, penetrates the stacked film, and is arranged on the substrate 200. In the example of FIG. 1, the columnar body 14 is formed in a cylindrical shape. The columnar body 14 may be formed in an ellipse shape as long as an arc can be formed on the outer periphery. The radial size of the columnar body 14 is larger than the arrangement pitch of the two conductive layers 10 forming a pair and larger than the arrangement pitch of the two conductive layers 21 forming a pair. A plurality of columnar bodies 14 are arranged in an array. The plurality of columnar bodies 14 are arranged in each region where the plurality of conductive layers 10 and the plurality of conductive layers 21 intersect.

Two of the conductive layers 10 forming a pair extend along the outer edges of the plurality of columnar bodies 14 in such a manner as to sandwich the plurality of columnar bodies 14 arranged in the x direction in which the conductive layers 10 extend. Therefore, each conductive layer 10 extends in an arc shape along substantially a half circumference of the outer edge of the columnar body 14 at a position where the conductive layer 10 collides with the columnar body 14, and otherwise, extends in a substantially straight line in the x direction. In addition, the other conductive layer 10 (third conductive layer) of the pair of the conductive layers 10 (first conductive layer) is arranged apart from one conductive layer 10 (first conductive layer) of the pair in a same plane.

Therefore, one conductive layer 10 of the pair extends in an arc shape along substantially a half circumference on one side of the outer edge of the columnar body 14 at a position where the conductive layer 10 collides with the columnar body 14, and otherwise extends in a substantially straight line in the x direction. The other conductive layer 10 of the pair extends in an arc shape along substantially a half circumference on the other side of the outer edge of the columnar body 14 at a position where the conductive layer 10 collides with the columnar body 14, and otherwise extends in a substantially straight line in the x direction.

Similarly, two of the conductive layers 21 forming a pair extend along the outer edges of the plurality of columnar bodies 14 in such a manner as to sandwich the plurality of columnar bodies 14 arranged in the y direction in which the conductive layers 21 extend. Therefore, each conductive layers 21 extends in an arc shape along substantially a half circumference of the outer edge of the columnar body 14 at a position where the conductive layer 21 collides with the columnar body 14, and otherwise, extends in a substantially straight line in the y direction. In addition, the other conductive layer 21 (fourth conductive layer) of the pair of the conductive layers 21 is arranged apart from one conductive layer 21 (second conductive layer) of the pair in a same plane.

Therefore, one conductive layer 21 of the pair extends in an arc shape along substantially a half circumference on one side of the outer edge of the columnar body 14 at a position where the conductive layer 21 collides with the columnar body 14, and otherwise extends in a substantially straight line in the y direction. The other conductive layer 21 of the pair extends in an arc shape along substantially a half circumference on the other side of the outer edge of the columnar body 14 at a position where the conductive film layer 21 collides with the columnar body 14, and otherwise extends in a substantially straight line in the y direction.

For example, one conductive layer 10 (first conductive layer) of the pair extends like a plate in the x direction orthogonal to the direction in which the columnar body 14 extends, and extends along an edge portion (first edge portion) corresponding to a part of the outer edge of the columnar body 14. In this case, for example, one conductive layer 21 (second conductive layer) of the pair extends like a plate in the y direction and extends along the edge portion (first edge portion) corresponding to a part of the outer edge of the columnar body 14. The edge portion (first edge portion) here is an edge portion of approximately a ¼ circumference which is an overlapping portion between the edge portion of approximately a half circumference where the one conductive layer 10 extends and the edge portion of approximately a half circumference where the one conductive layer 21 extends.

In addition, the other conductive layer 10 (third conductive layer) of the pair extends like a plate in the x direction orthogonal to the direction in which the columnar body 14 extends, and extends along an edge portion (second edge portion) corresponding to another part of the outer edge of the columnar body 14. In this case, one conductive layer 21 (second conductive layer) of the pair further extends along the edge portion (second edge portion) corresponding to another part of the outer edge of the columnar body 14. The edge portion (second edge portion) here is an edge portion of approximately a ¼ circumference which is another overlapping portion between the edge portion of approximately a half circumference where the other conductive layer 10 extends and the edge portion of approximately a half circumference where the one conductive layer 21 extends.

For example, one conductive layer 10 (first conductive layer) of the pair further extends along an edge portion (third edge portion) corresponding to another part of the outer edge of the columnar body 14. In this case, for example, the other conductive layer 21 (fourth conductive layer) of the pair extends like a plate in the y direction and extends along the edge portion (third edge portion) corresponding to another part of the outer edge of the columnar body 14. The edge portion (third edge portion) here is an edge portion of approximately a ¼ circumference which is an overlapping portion between the edge portion of approximately a half circumference where the one conductive layer 10 extends and the edge portion of approximately a half circumference where the other conductive layer 21 extends.

For example, the other conductive layer 10 (third conductive layer) of the pair further extends along an edge portion (fourth edge portion) corresponding to another part of the outer edge of the columnar body 14. In this case, for example, the other conductive layer 21 (fourth conductive layer) of the pair extends like a plate in the y direction and extends along the edge portion (fourth edge portion) corresponding to another part of the outer edge of the columnar body 14. The edge portion (fourth edge portion) here is an edge portion of approximately a ¼ circumference which is an overlapping portion between the edge portion of approximately a half circumference where the other conductive layer 10 extends and the edge portion of approximately a half circumference where the other conductive layer 21 extends.

Therefore, the conductive layer 10 and the conductive layer 21 along the outer periphery overlap in an arc shape at a total of four places of 45 degrees, 135 degrees, 225 degrees, and 315 degrees counterclockwise from the x axis when viewed from the center of each columnar body 14. In addition, in a region where the conductive layer 10 and the conductive layer 21 intersect, the memory film 20 is arranged in such a manner as to be sandwiched between the conductive layer 10 and the conductive layer 21 in the z direction (third direction) intersecting the x direction and the y direction. More specifically, the memory film 20 is arranged in such a manner as to be sandwiched between the conductive layer 10 and the conductive layer 21 in the z direction 14 in which the columnar body extends in a region along the edge portion of the columnar body 14 where the conductive layer 10 and the conductive layer 21 intersect. Therefore, one memory cell is formed by a combination of the conductive layer 10 serving as a word line, the memory film 20, and the conductive layer 21 serving as a channel layer. Each memory cell 11 is formed at a position where the conductive layer 10 and the conductive layer 21 overlap in an arc shape. In the example of FIG. 1, each memory cell 11 is formed in an arc shape using a part of the conductive layer 21, a part of the memory film 20, and a part of the conductive layer 10, in a region where the conductive layer 10 and the conductive layer 21 intersect.

For example, a first memory cell is formed using a part of the one conductive layer 21 (second conductive layer) of the pair, a part of the memory film 20 (first memory film) surrounding the conductive layer 21, and a part of the one conductive layer 10 (first conductive layer) of the pair, at a position where the conductive layer 10 and the conductive layer 21 intersect. Here, the memory film 20 (first memory film) is arranged in such a manner as to be sandwiched between the one conductive layer 10 and the one conductive layer 21 in the z direction in which the columnar body 14 extends in a region along the edge portion (first edge portion) of the columnar body 14 where the conductive layer 10 and the conductive layer 21 intersect.

In addition, a second memory cell is formed using a part of the one conductive layer 10 (second conductive layer) of the pair, a part of the memory film 20 (first memory film) surrounding the conductive layer 21, and a part of the other conductive layer 10 (third conductive layer) of the pair, at a position where the conductive layer 10 and the conductive layer 21 intersect. Here, the memory film 20 (first memory film) is arranged in such a manner as to be sandwiched between the other conductive layer 10 and the one conductive layer 21 in the z direction in which the columnar body 14 extends in a region along the edge portion (second edge portion) of the columnar body 14 where the other conductive layer 10 and the one conductive layer 21 intersect.

In addition, a third memory cell is formed using a part of the other conductive layer 21 (fourth conductive layer) of the pair, a part of the memory film 20 (second memory film) surrounding the conductive layer 21, and a part of the one conductive layer 10 (first conductive layer) of the pair, at a position where the conductive layer 10 and the conductive layer 21 intersect. Here, the memory film 20 (second memory film) is arranged in such a manner as to be sandwiched between the one conductive layer 10 and the other conductive layer 21 in the z direction in which the columnar body 14 extends in a region along the edge portion (third edge portion) of the columnar body 14 where the one conductive layer 10 and the other conductive layer 21 intersect.

In addition, a fourth memory cell is formed using a part of the other conductive layer 21 (fourth conductive layer) of the pair, a part of the memory film 20 (second memory film) surrounding the conductive layer 21, and a part of the other conductive layer 10 (third conductive layer) of the pair, at a position where the conductive layer 10 and the conductive layer 21 intersect. Here, the memory film 20 (second memory film) is arranged in such a manner as to be sandwiched between the other conductive layer 10 and the other conductive layer 21 in the z direction in which the columnar body 14 extends in a region along the edge portion (fourth edge portion) of the columnar body 14 where the other conductive layer 10 and the other conductive layer 21 intersect.

Therefore, for each columnar body 14, four memory cells are formed by two conductive layers 10 forming a pair in a same layer, two conductive layers 21 forming a pair in a same layer overlapping the conductive layers 10 for example on the lower layer side, and each memory film 20 surrounding the two conductive layers 21.

In addition, as shown in FIG. 2, the conductive layer 10 and the conductive layer 21 surrounded by the memory film 20 are alternately stacked at four locations (for example, the portion A) where the conductive layer 10 and the conductive layer 21 overlap in an arc shape. Therefore, one conductive layer 10, one memory film 20 in contact with the upper face of the conductive layer 10, and one conductive layer 21 constitute one memory cell 11. In addition, the same one conductive layer 10, another memory film 20 in contact with the lower face of the conductive layer 10, and another conductive layer 21 constitute one memory cell 11. Therefore, for each columnar body 14, because the memory cell 11 is formed on the upper and lower faces of two conductive layers 10 forming a pair in a same layer, a total of eight memory cells 11 of four memory cells 11 on the upper face side and four memory cells 11 on the lower face side can be formed.

Then, one NAND string is formed by a plurality of memory cells connecting the memory cells 11 formed at positions where a same conductive layer 21 and memory film 20 overlap the plurality of conductive layers 10.

As described above, even when the conductive layer 21 extends in the direction orthogonal to the stacking direction of the stacked film without extending in the stacking direction of the stacked film, it is possible to increase the degree of integration of the memory cells. FIGS. 1 to 6 show an example in which two conductive layers 10 and two conductive layers 21 are alternately arranged with the memory film 20 interposed between them. Any number of stacked layers of the conductive layer 10 and the conductive layer 21 may be employed, and it is also preferable to further increase the degree of integration of the memory cells by alternately stacking more conductive layers 10 and more conductive layers 21 with the memory film 20 interposed between them.

As shown in FIG. 1, a plurality of memory cells 11 are arranged in an array in a same layer in the stacked film. Dielectric films 13 and 15 serving as a plurality of walls are arranged along a frame of a region surrounded by 2×2 memory cells 11 adjacent to each other in a same plane among the plurality of memory cells 11. Two sides of the frame in the y direction are formed by two dielectric films 15. Two sides of the frame in the x direction are formed by two dielectric films 13. The dielectric films 13 and 15 are arranged in such a manner as to penetrate the stacked film. Therefore, the combination (a plurality of walls) of the two dielectric films 13 and the two dielectric films 15 separates the portion inside the frame and the portion outside the frame of the region surrounded by 2×2 memory cells 11 in a same plane in the stacked film.

As shown in FIG. 1, one conductive layer 21 and the other conductive layer 21 forming a pair are separated by the dielectric film 13. The memory film 20 (first memory film) is arranged on the upper face side, the lower face side, and a side of one of both side faces of the one conductive layer 21 of the pair in a region where the one conductive layer 21 of the pair extends not along the outer edge of the columnar body 14. Specifically, as shown in FIG. 3, at a position where no memory cell is formed, the memory film 20 (first memory film) is arranged on the side face opposite to the other conductive layer 21 of the pair and not arranged on the side face on the other conductive layer 21 side, of both side faces of the one conductive layer 21 of the pair.

The memory film 20 (second memory film) is arranged on the upper face side, the lower face side, and a side of one of both side faces of the other conductive layer 21 of the pair in a region where the other conductive layer 21 of the pair extends not along the outer edge of the columnar body 14. Specifically, as shown in FIG. 3, at a position where no memory cell is formed, the memory film 20 (second memory film) is arranged on the side face opposite to the one conductive layer 21 of the pair and not arranged on the side face on the one conductive layer 21 side, of both side faces of the other conductive layer 21 of the pair.

Figure 7:
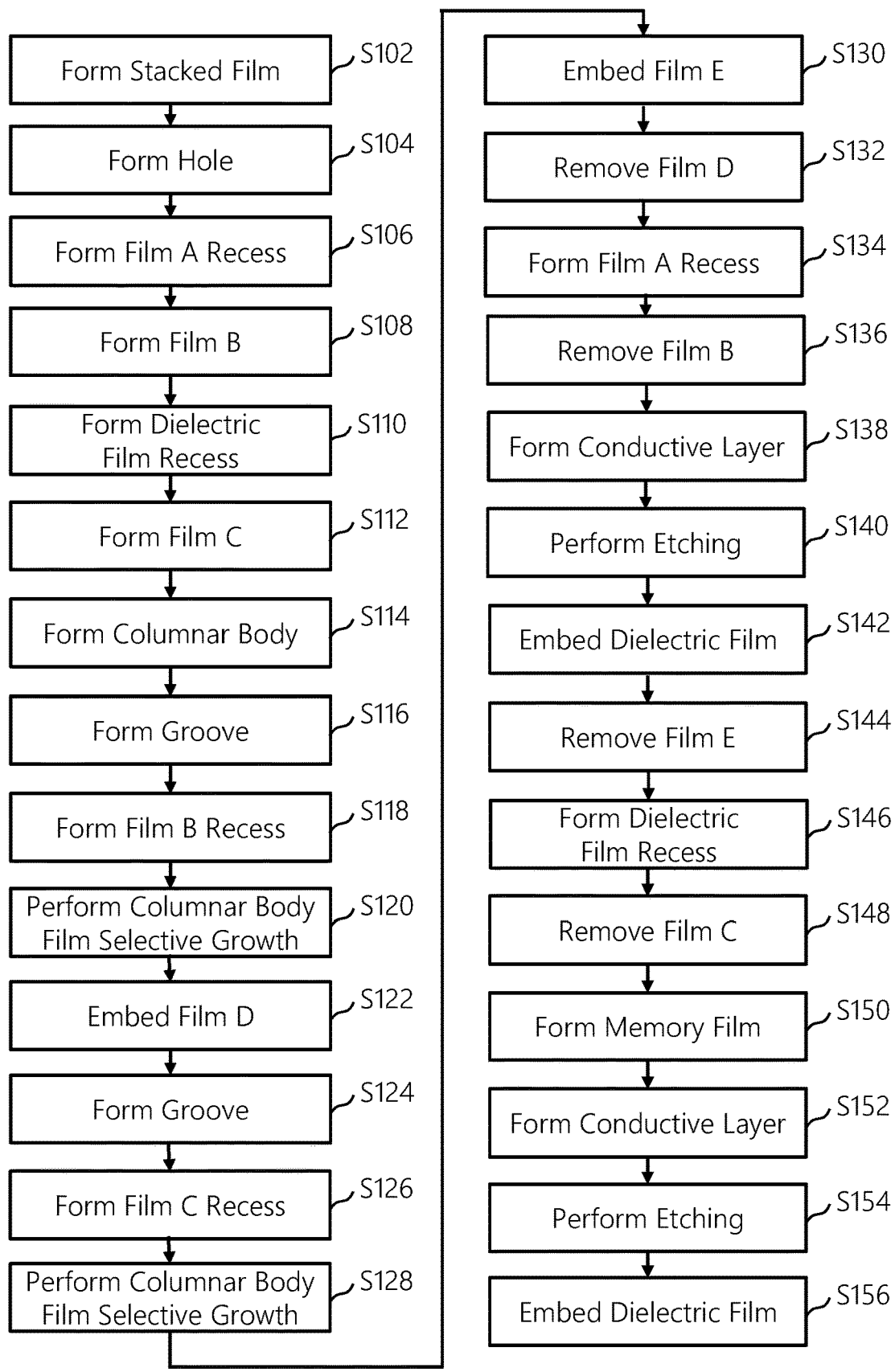
FIG. 7 is a flowchart showing main steps of a method for fabricating the semiconductor device according to the first embodiment.

FIG. 7 is a flowchart showing main steps of a method for fabricating the semiconductor device according to the first embodiment. In FIG. 7, in the method for fabricating the semiconductor device according to the first embodiment, a series of steps including a stacked film formation step (S102), a hole formation step (S104), a film A recess formation step (S106), a film B formation step (S108), a dielectric film recess formation step (S110), a film C formation step (S112), a columnar body formation step (S114), a groove formation step (S116), a film B recess formation step (S118), a columnar body film selective growth step (S120), a film D embedding step (S122), a groove formation step (S124), a film C recess formation step (S126), a columnar body film selective growth step (S128), a film E embedding step (S130), a film D removal step (S132), a film A recess formation step (S134), a film B removal step (S136), a conductive layer formation step (S138), an etching step (S140), a dielectric film embedding step (S142), a film E removal step (S144), a dielectric film recess formation step (S146), a film C removal step (S148), a memory film formation step (S150), a conductive layer formation step (S152), an etching step (S154), and a dielectric film embedding step (S156) is performed.

Figure 8:
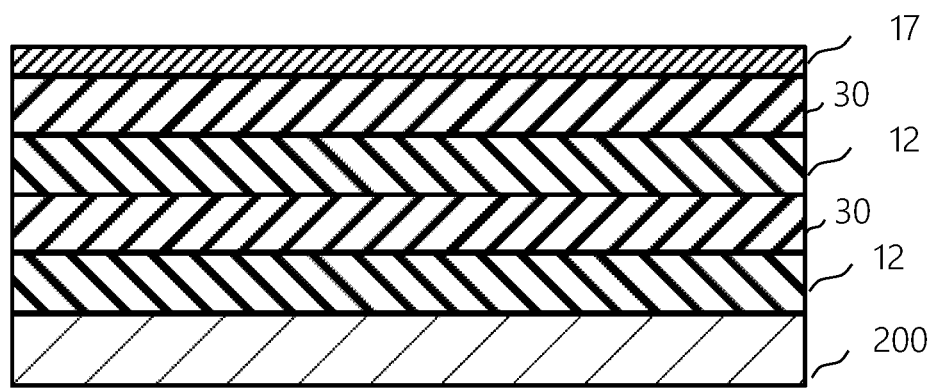
FIG. 8 is a cross-sectional view showing a part of the steps of the method for fabricating the semiconductor device according to the first embodiment.
Figure 8:
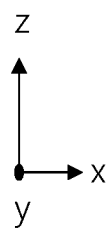

FIG. 8 is a cross-sectional view showing a part of the steps of the method for fabricating the semiconductor device according to the first embodiment. FIG. 8 shows the stacked film formation step (S102) of FIG. 7. The subsequent steps will be described later.

In FIG. 8, as the stacked film formation step (S102), the oxide film layers 12 and the nitride film layers 30 are first alternately stacked on the semiconductor substrate 200 by for example an atomic layer vapor deposition (ALD) method, an atomic layer chemical vapor deposition (AL-CVD) method, or a chemical vapor deposition (CVD) method. In the example of FIG. 8, a case where one oxide film layer 12 is first formed on the semiconductor substrate 200, and then nitride film layers 30 and oxide film layers 12 are alternately stacked is shown. Through this step, a stacked film (stacked body) in which each of the plurality of nitride film layers 30 and each of the plurality of the oxide film layers 12 are alternately stacked is formed. As the film used for the nitride film layer 30, for example a silicon nitride film (SiN film) is preferably used. As the film used for the oxide film layer 12, for example a silicon oxide film ($SiO_2$ film) is preferably used. The nitride film layer 30 and the oxide film layer 12 function as dielectric films. As the semiconductor substrate 200, for example a silicon wafer having a diameter of 300 mm is used. Other dielectric films, wires, contacts, and/or semiconductor elements such as transistors (not shown) may be formed on or in the semiconductor substrate above which the nitride film layers 30 and the oxide film layers 12 are alternately stacked.

In addition, a protective film 17 is formed on the nitride film layer 30 as the uppermost layer of the stacked film by a CVD method. As a material of the protective film 17, for example polysilicon is preferably used.

Figure 9:
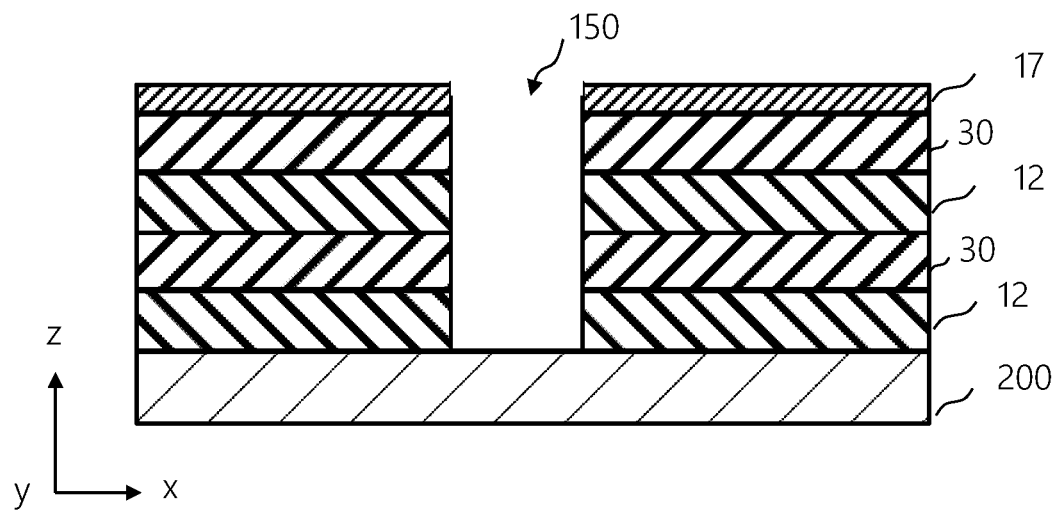
FIG. 9 is a cross-sectional view showing another part of the steps of the method for fabricating the semiconductor device according to the first embodiment.
Figure 10:
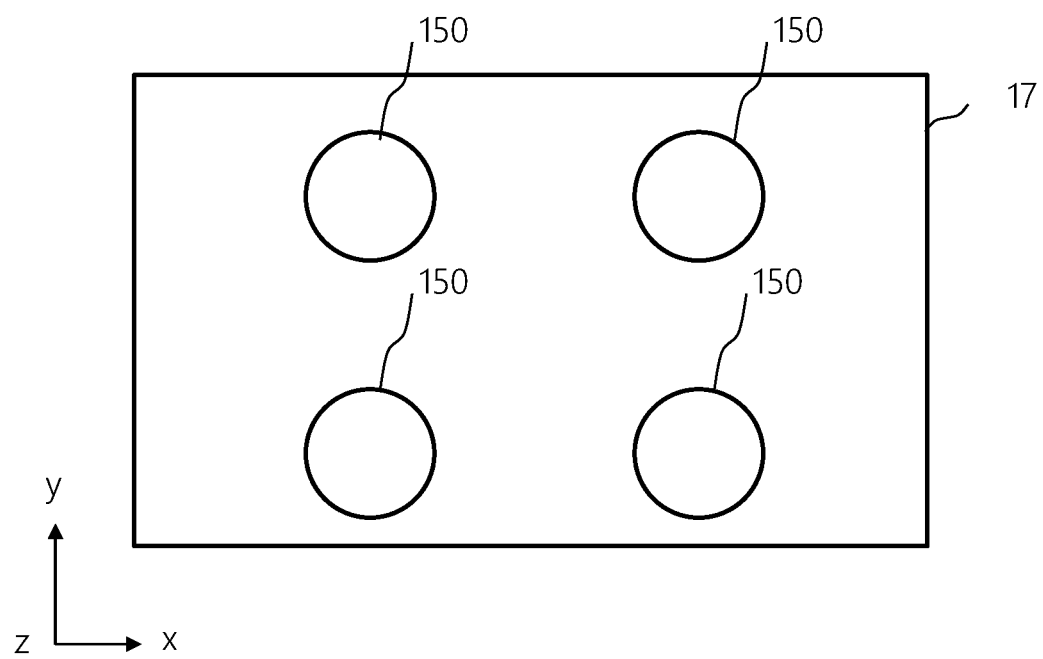
FIG. 10 is a top view showing another part of the steps of the method for fabricating the semiconductor device according to the first embodiment.

FIG. 9 is a cross-sectional view showing another part of the steps of the method for fabricating the semiconductor device according to the first embodiment. FIG. 10 is a top view showing another part of the steps of the method for fabricating the semiconductor device according to the first embodiment. FIGS. 9 and 10 show the hole formation step (S104) in FIG. 7. The subsequent steps will be described later. The scale does not match between the cross-sectional view of FIG. 9 and the top view of FIG. 10. The same applies to the following drawings.

In FIGS. 9 and 10, as the hole formation step (S104), a plurality of openings (holes) 150 having for example a circular cross section is formed. The openings penetrate the protective film 17 and the stacked film from above the protective film 17. The radial size of each hole 150 is made larger than the arrangement pitch of the two conductive layers 20 forming a pair. Similarly, the radial size of each hole 150 is made larger than the arrangement pitch of the two conductive layers 21 forming a pair. The plurality of holes 150 are formed in an array.

Specifically, in a state where a resist film is formed on the protective film 17 through a lithography process such as a resist coating process and an exposure process (not shown), the holes 150 can be formed substantially perpendicularly to the surface of the protective film 17 by removing the exposed protective film 17 and the stacked film of the nitride film layer 30 and the oxide film layer 12 located under the exposed protective film 17 by an anisotropic etching method. As one example, the holes may be formed by a reactive ion etching (RIE) method. After the hole formation, the exposed upper face and side face of the protective film 17 and the silicon face of the upper face of the substrate 200 are selectively oxidized.

Figure 11:
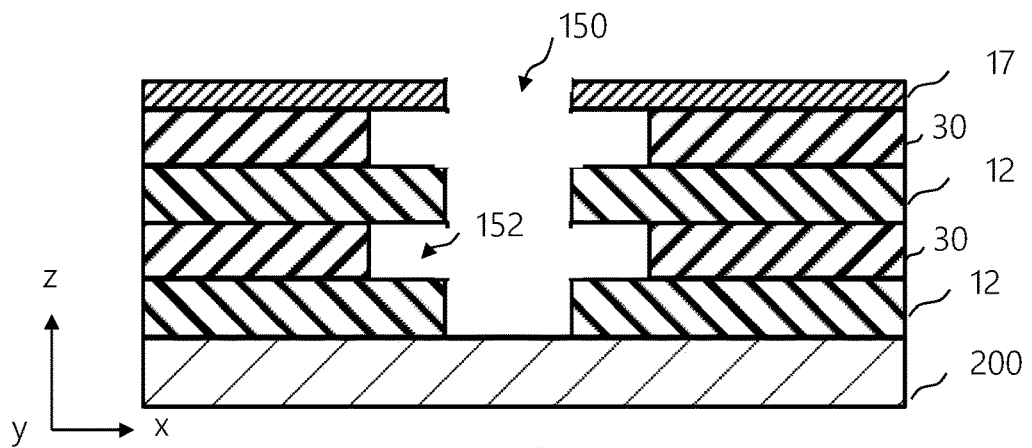
FIG. 11 is a cross-sectional view showing another part of the steps of the method for fabricating the semiconductor device according to the first embodiment.
Figure 12:
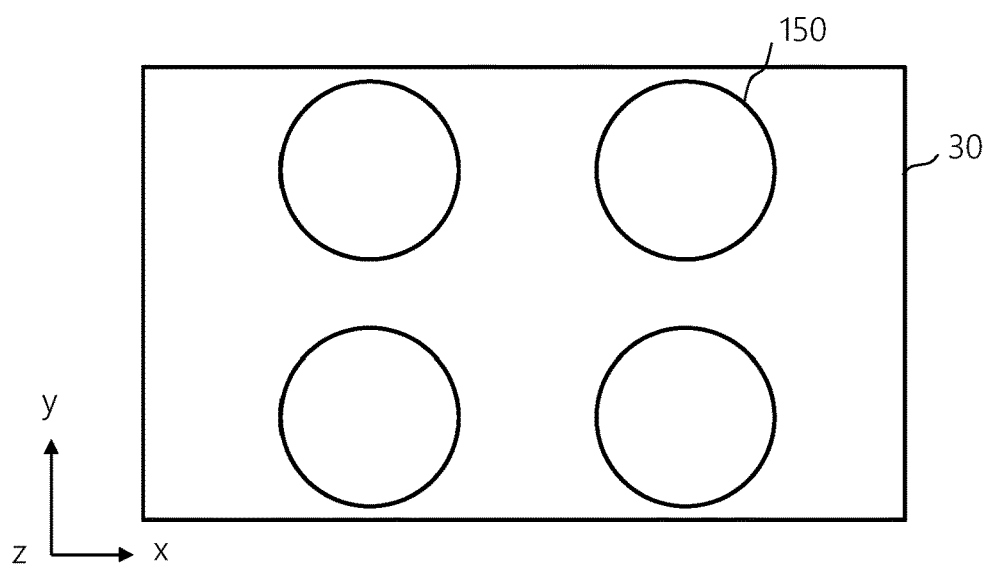
FIG. 12 is a top view showing another part of the steps of the method for fabricating the semiconductor device according to the first embodiment.
Figure 13:
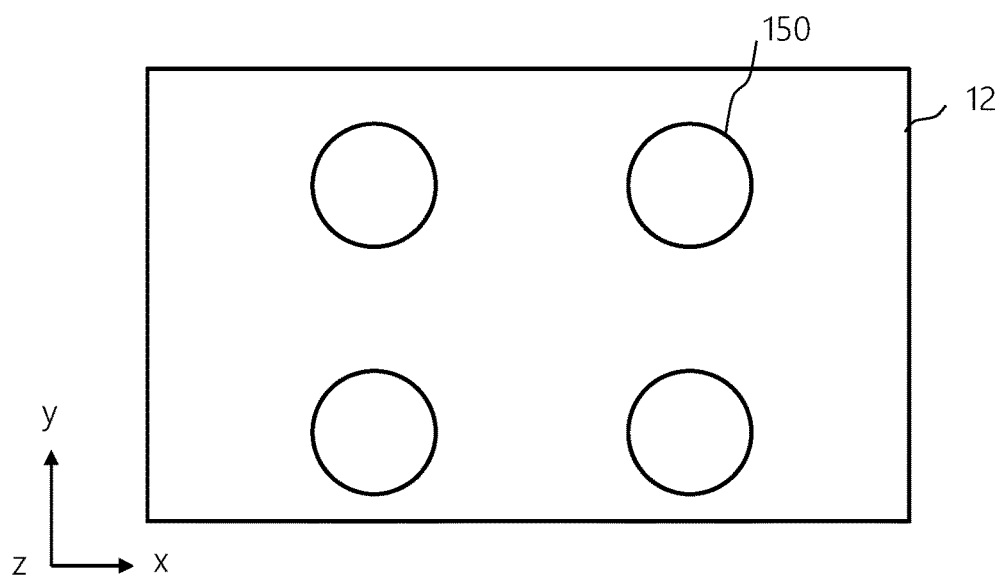
FIG. 13 is a top view showing another part of the steps of the method for fabricating the semiconductor device according to the first embodiment.

FIG. 11 is a cross-sectional view showing another part of the steps of the method for fabricating the semiconductor device according to the first embodiment. FIG. 12 is a top view showing another part of the steps of the method for fabricating the semiconductor device according to the first embodiment. FIG. 13 is a top view showing another part of the steps of the method for fabricating the semiconductor device according to the first embodiment. FIGS. 11 to 13 show the film A recess formation step (S106) in FIG. 7. The subsequent steps will be described later. FIG. 12 is a top view of the nitride film layer 30. FIG. 13 is a top view of the oxide film layer 12.

In FIGS. 11 to 13, as the film A recess formation step (S106), each nitride film layer 30 (film A) in the stacked film is etched from the inner wall of the hole 150 into the nitride film layer 30 via the hole 150. For example, removal is performed by a wet etching method using phosphoric acid or water ($H_2O$). As a result, a recess (recessed portion) 152 having a desired width is formed in each nitride film layer 30 from the inner wall of the hole 150. In each nitride film layer 30, the diameter size of the opening can be made larger than that of the oxide film layer 12 by the recess 152. The widening size is preferably about the line width size of the word line, for example.

Figure 14:
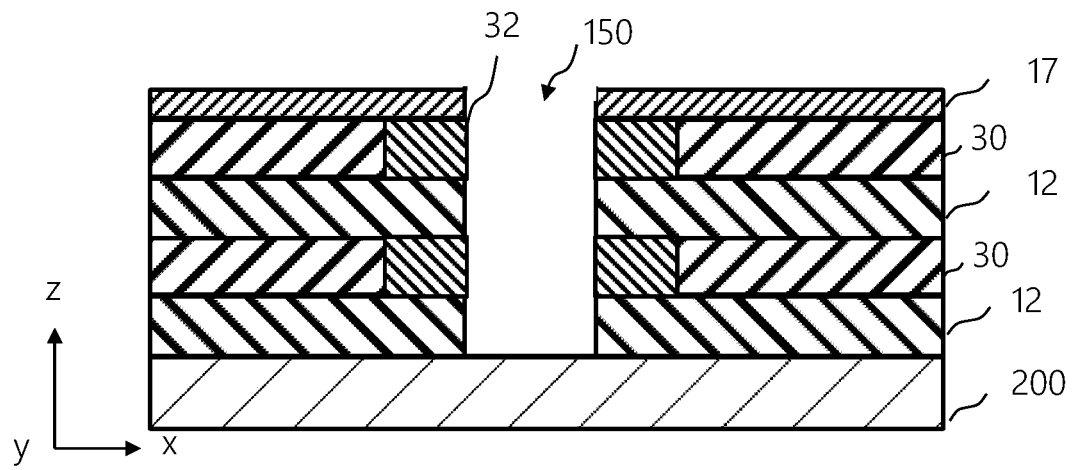
FIG. 14 is a cross-sectional view showing another part of the steps of the method for fabricating the semiconductor device according to the first embodiment.
Figure 15:
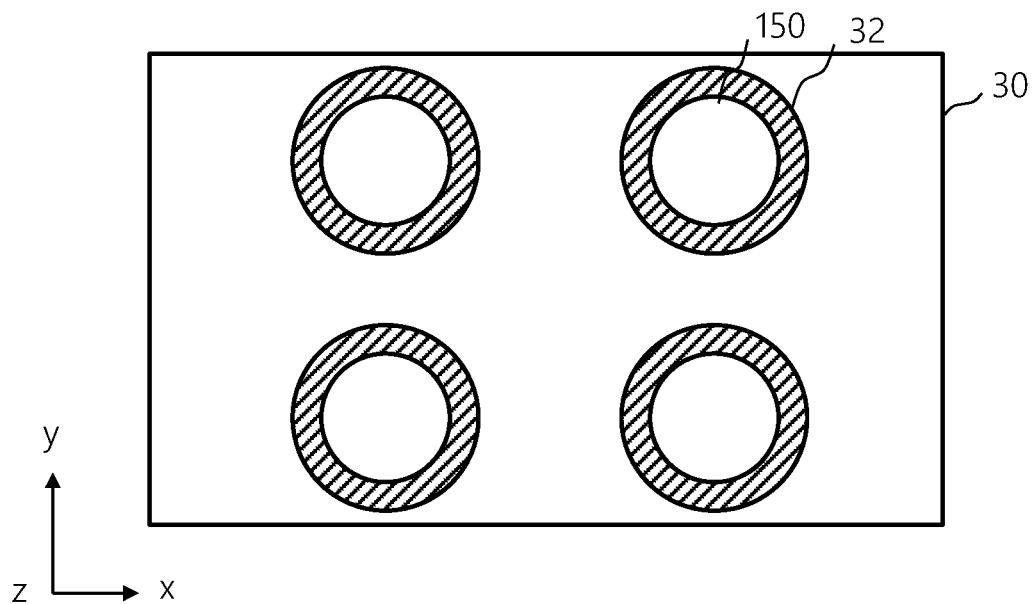
FIG. 15 is a top view showing another part of the steps of the method for fabricating the semiconductor device according to the first embodiment.

FIG. 14 is a cross-sectional view showing another part of the steps of the method for fabricating the semiconductor device according to the first embodiment. FIG. 15 is a top view showing another part of the steps of the method for fabricating the semiconductor device according to the first embodiment. FIGS. 14 and 15 show the film B formation step (S108) in FIG. 7. The subsequent steps will be described later. FIG. 15 is a top view of the nitride film layer 30. The top view of the oxide film layer 12 is the same as FIG. 13.

In FIGS. 14 and 15, as the film B formation step (S108), a sacrificial film 32 (film B) is formed in the recess 152 formed in each nitride film layer 30 by a CVD method. Here, the sacrificial film 32 is formed in such a manner as to completely fill the recess 152. Excess sacrificial film 32 formed in the hole 150 and on the protective film 17 other than the recess 152 is removed by directional etching (for example, RIE) after the film formation. As a material of the sacrificial film 32, for example carbon (C) is preferably used.

Figure 16:
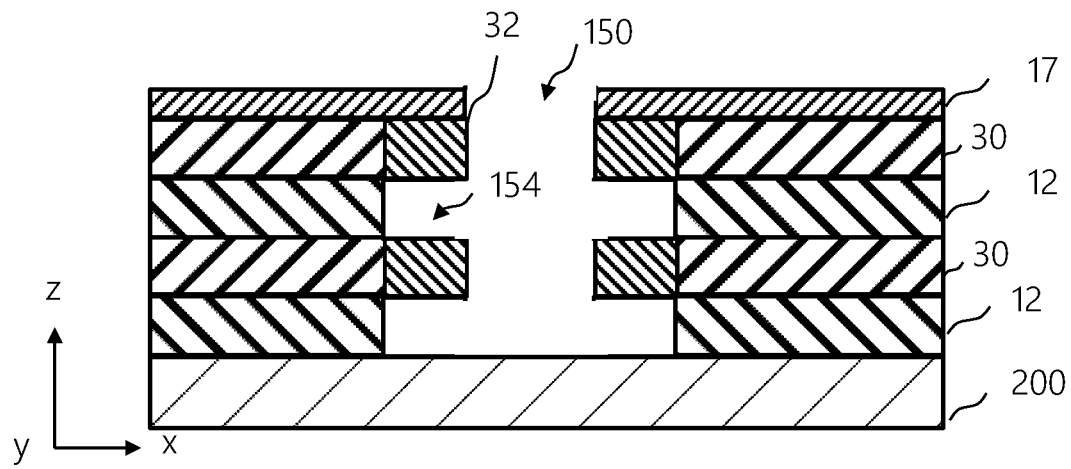
FIG. 16 is a cross-sectional view showing another part of the steps of the method for fabricating the semiconductor device according to the first embodiment.
Figure 17:
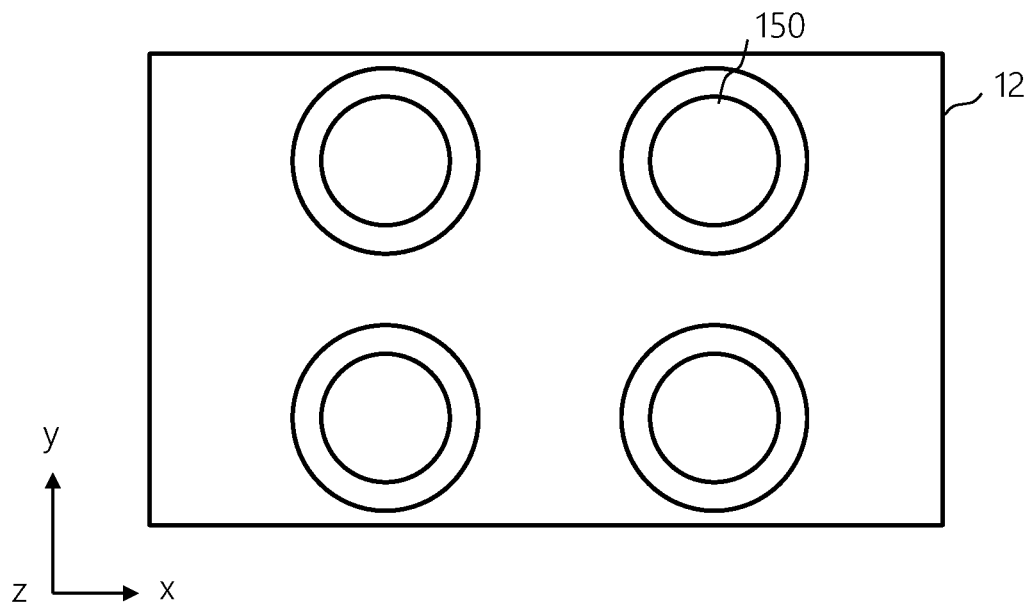
FIG. 17 is a top view showing another part of the steps of the method for fabricating the semiconductor device according to the first embodiment.

FIG. 16 is a cross-sectional view showing another part of the steps of the method for fabricating the semiconductor device according to the first embodiment. FIG. 17 is a top view showing another part of the steps of the method for fabricating the semiconductor device according to the first embodiment. FIGS. 16 and 17 show the dielectric film recess formation step (S110) in FIG. 7. The subsequent steps will be described later. FIG. 17 is a top view of the oxide film layer 12. A top view of the nitride film layer 30 is the same as FIG. 15.

In FIGS. 16 and 17, as the dielectric film recess formation step (S110), etching of each oxide film layer 12 in the stacked film is performed from the inner wall of the hole 150 into the oxide film layer 12 via the hole 150. For example, removal is performed by a wet etching method using hydrofluoric acid (HF). As a result, a recess (recessed portion) 154 having a desired width is formed in each oxide film layer 12 from the inner wall of the hole 150. In each oxide film layer 12, the diameter size of the opening can be made larger than that of the sacrificial film 32 by the recess 154. The widened size is preferably about the line width size of the word line or a channel body covered with the memory film, for example.

Figure 18:
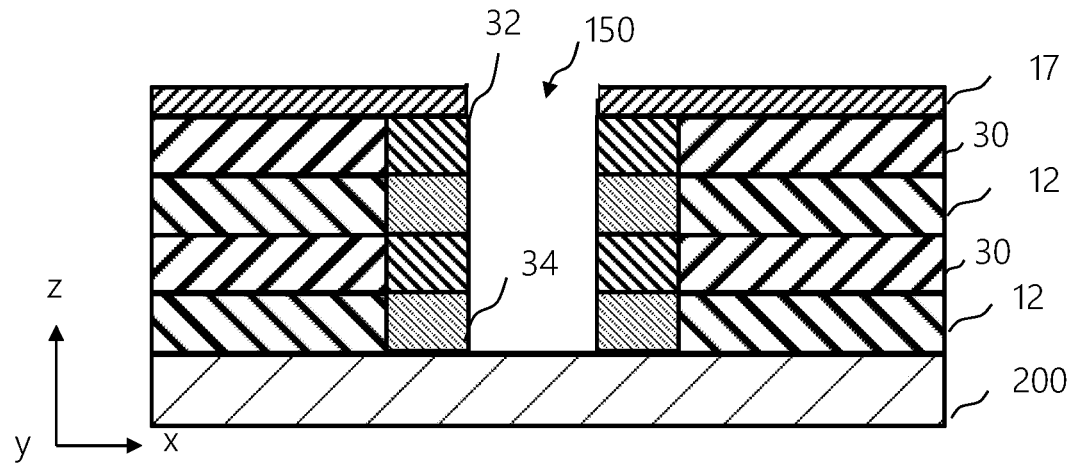
FIG. 18 is a cross-sectional view showing another part of the steps of the method for fabricating the semiconductor device according to the first embodiment.
Figure 19:
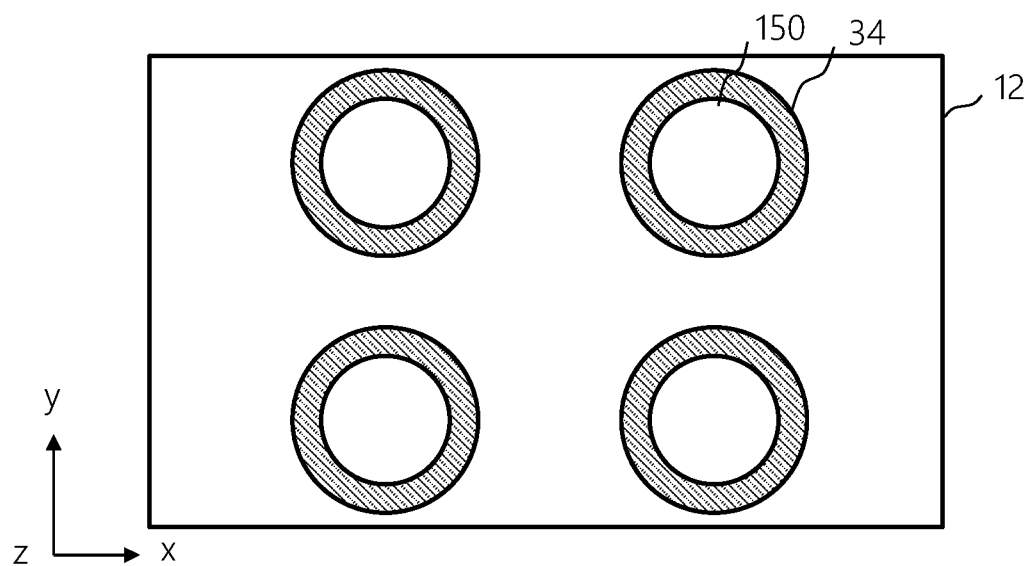
FIG. 19 is a top view showing another part of the steps of the method for fabricating the semiconductor device according to the first embodiment.

FIG. 18 is a cross-sectional view showing another part of the steps of the method for fabricating the semiconductor device according to the first embodiment. FIG. 19 is a top view showing another part of the steps of the method for fabricating the semiconductor device according to the first embodiment. FIGS. 18 and 19 show the film C formation step (S112) in FIG. 7. The subsequent steps will be described later. FIG. 19 is a top view of the oxide film layer 12. A top view of the nitride film layer 30 is the same as FIG. 15.

In FIGS. 18 and 19, as the film C formation step (S112), a sacrificial film 34 (film C) is formed in the recess 154 formed in each oxide film layer 12 by a CVD method. Here, the sacrificial film 34 is formed in such a manner as to completely fill the recess 154. Excess sacrificial film 34 formed in the hole 150 and on the protective film 17 other than the recess 154 is removed by directional etching (for example, RIE) after the film formation. As a material of the sacrificial film 34, for example tungsten (W) is preferably used.

Figure 20:
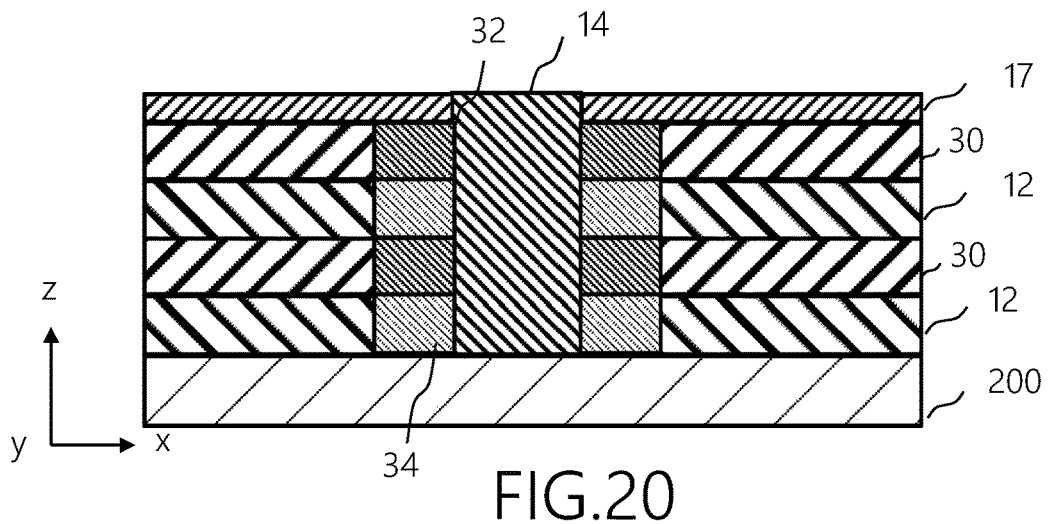
FIG. 20 is a cross-sectional view showing another part of the steps of the method for fabricating the semiconductor device according to the first embodiment.
Figure 21:
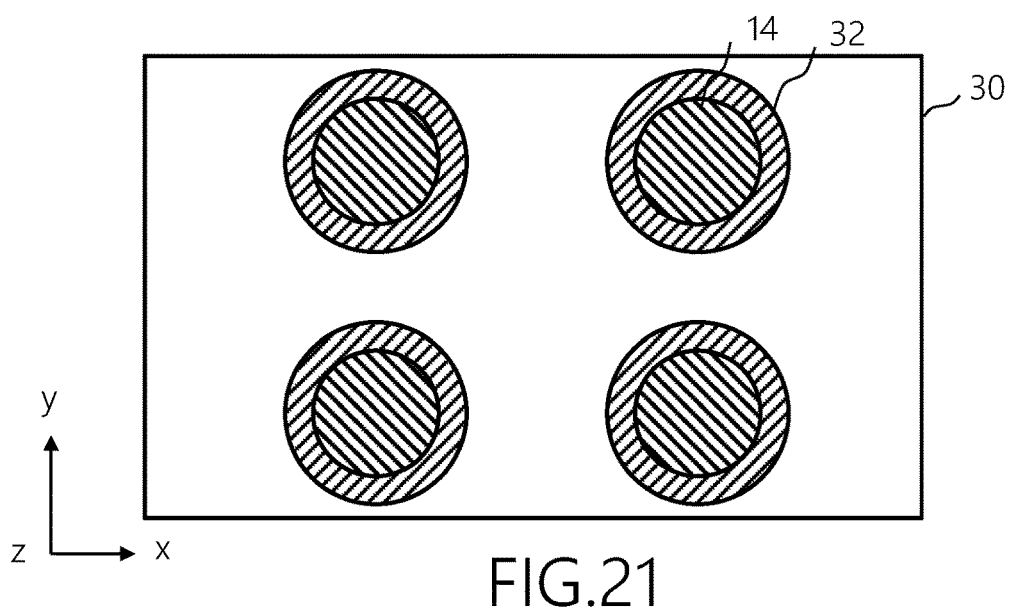
FIG. 21 is a top view showing another part of the steps of the method for fabricating the semiconductor device according to the first embodiment.
Figure 22:
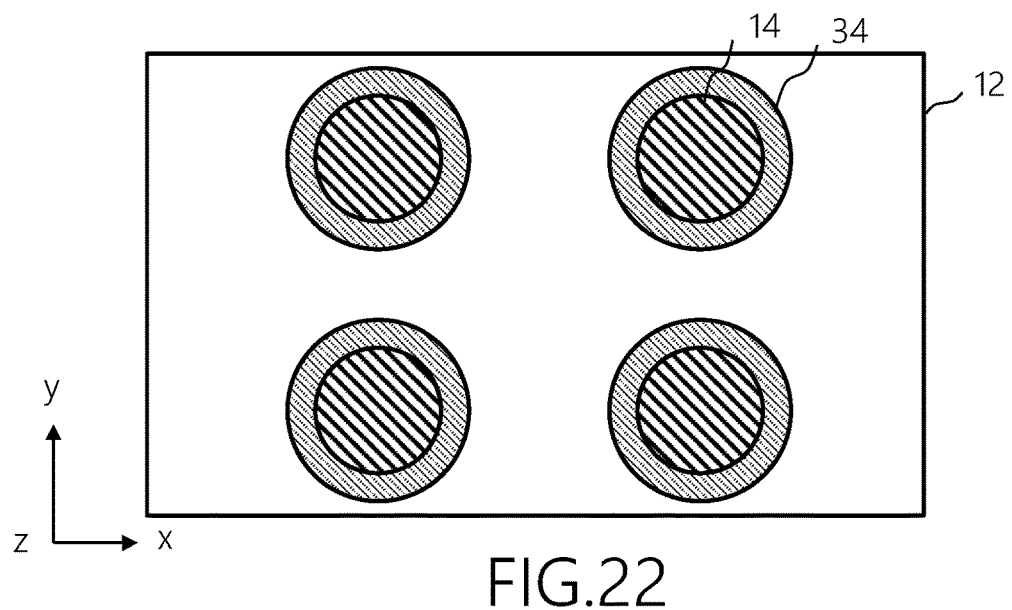
FIG. 22 is a top view showing another part of the steps of the method for fabricating the semiconductor device according to the first embodiment.

FIG. 20 is a cross-sectional view showing another part of the steps of the method for fabricating the semiconductor device according to the first embodiment. FIG. 21 is a top view showing another part of the steps of the method for fabricating the semiconductor device according to the first embodiment. FIG. 22 is a top view showing another part of the steps of the method for fabricating the semiconductor device according to the first embodiment. FIGS. 20 to 22 show the columnar body formation step (S114) in FIG. 7. The subsequent steps will be described later. FIG. 21 is a top view of the nitride film layer 30. FIG. 22 is a top view of the oxide film layer 12.

In FIGS. 20 to 22, as the columnar body formation step (S114), the columnar body 14 is formed in such a manner as to embed each hole 150 by a CVD method. Excess film formed on the protective film 17 other than the hole 150 is removed by directional etching (for example, RIE) after the film formation. As a material of the sacrificial film 34, for example polysilicon is preferably used.

Figure 23:
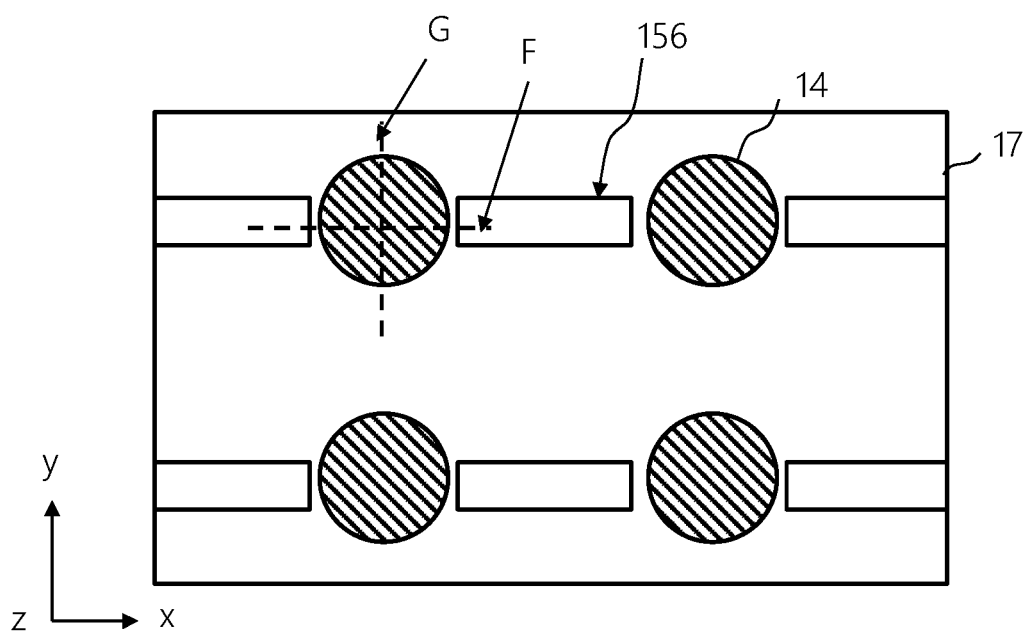
FIG. 23 is a top view showing another part of the steps of the method for fabricating the semiconductor device according to the first embodiment.
Figure 24:
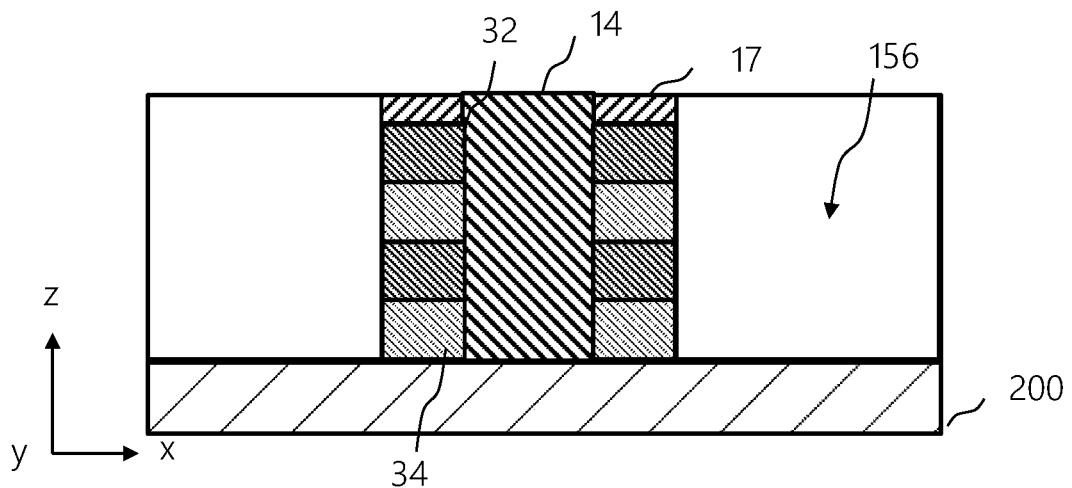
FIG. 24 is a cross-sectional view showing another part of the steps of the method for fabricating the semiconductor device according to the first embodiment.
Figure 25:
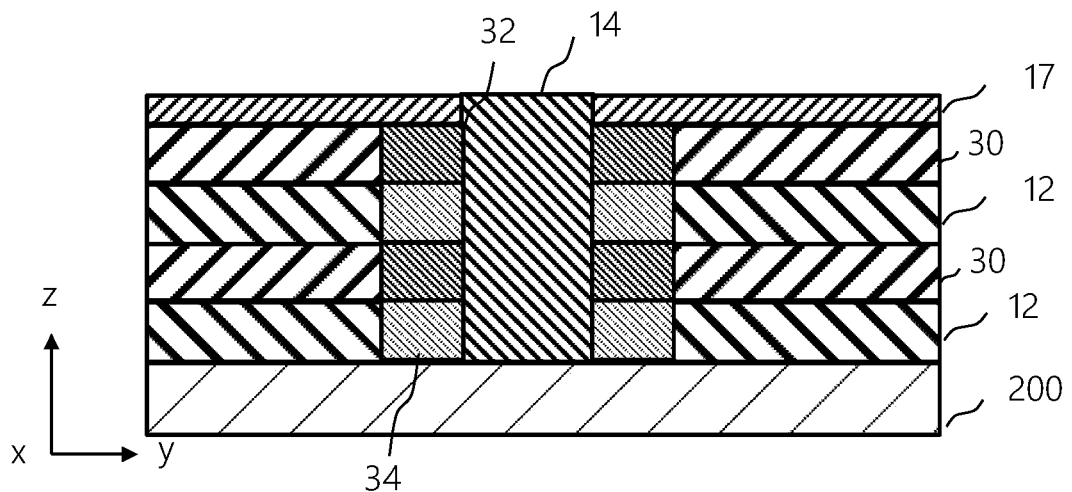
FIG. 25 is a cross-sectional view showing another part of the steps of the method for fabricating the semiconductor device according to the first embodiment.
Figure 26:
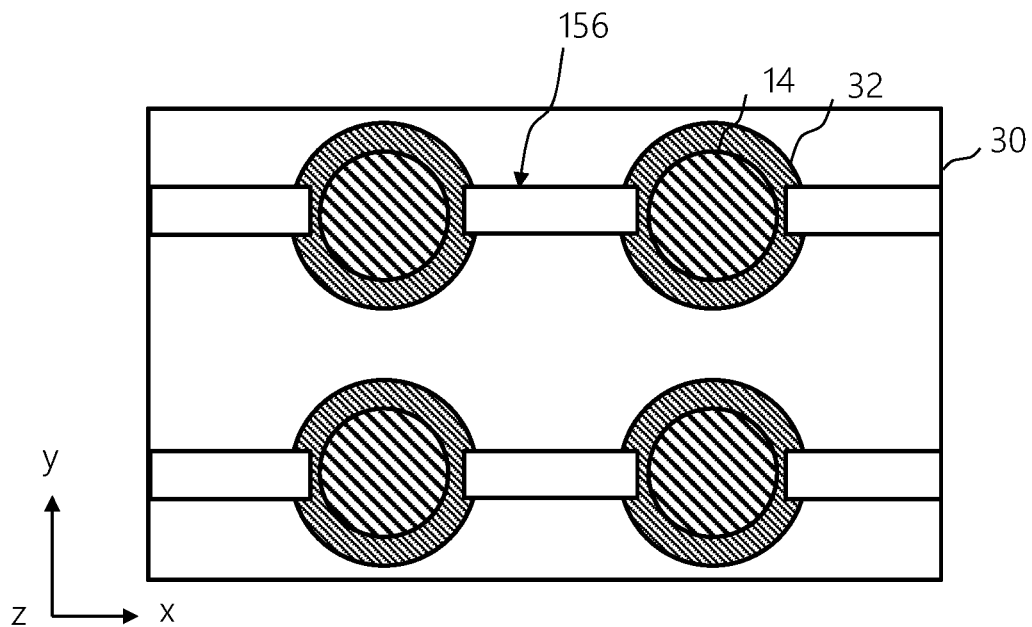
FIG. 26 is a top view showing another part of the steps of the method for fabricating the semiconductor device according to the first embodiment.
Figure 27:
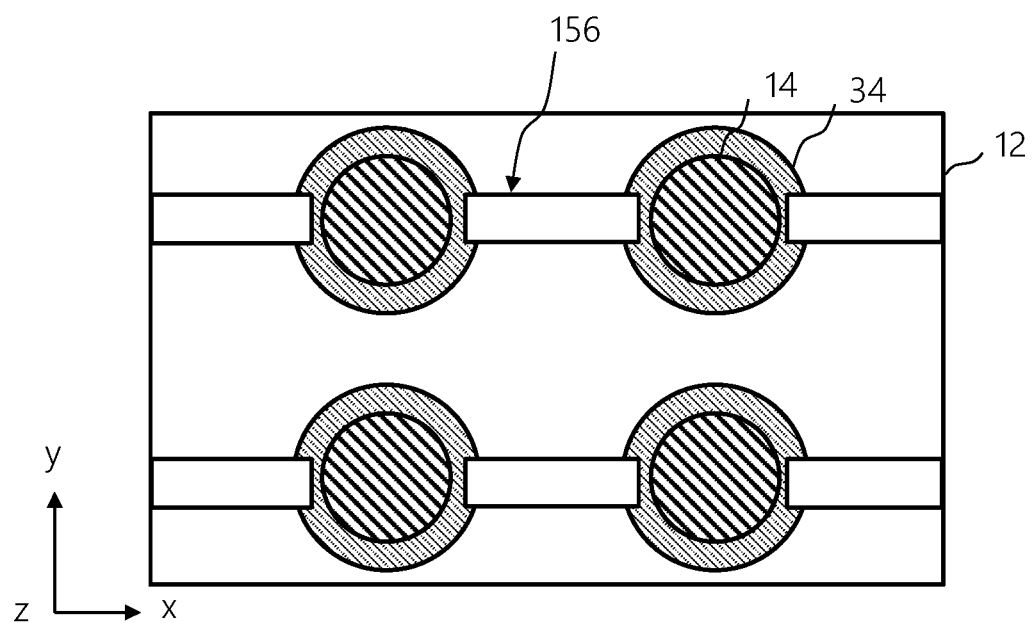
FIG. 27 is a top view showing another part of the steps of the method for fabricating the semiconductor device according to the first embodiment.

FIG. 23 is a top view showing another part of the steps of the method for fabricating the semiconductor device according to the first embodiment. FIG. 24 is a cross-sectional view showing another part of the steps of the method for fabricating the semiconductor device according to the first embodiment. FIG. 25 is a cross-sectional view showing another part of the steps of the method for fabricating the semiconductor device according to the first embodiment. FIG. 26 is a top view showing another part of the steps of the method for fabricating the semiconductor device according to the first embodiment. FIG. 27 is a top view showing another part of the steps of the method for fabricating the semiconductor device according to the first embodiment. FIGS. 23 to 27 show the groove formation step (S116) in FIG. 7. The subsequent steps will be described later. FIG. 23 is a top view of the protective film 17. FIG. 24 shows a cross section of the portion F in FIG. 23 in the y direction centered on the columnar body 14. FIG. 25 shows a cross section of the portion G in FIG. 23 in the x direction centered on the columnar body 14. FIG. 26 is a top view of the nitride film layer 30. FIG. 27 is a top view of the oxide film layer 12.

In FIGS. 23 to 27, as the groove formation step (S116), a plurality of grooves 156 (trenches) extending in the x direction are formed between the columnar bodies 14 adjacent in the x direction of the plurality of columnar bodies 14 arranged in an array. As shown in FIG. 24, the plurality of grooves 156 are open from the top of the protective film 17 to the substrate 200 through the stacked film. In the nitride film layer 30, as shown in FIGS. 24 and 26, each groove 156 reaches a part of the sacrificial film 32 without reaching the columnar body 14. In other words, the nitride film layer 30 is not left between the edge of the groove 156 and the columnar body 14, and a part of the sacrificial film 32 is left. Similarly, in the oxide film layer 12, each groove 156 reaches a part of the sacrificial film 34 without reaching the columnar body 14 as shown in FIGS. 24 and 27. In other words, the oxide film layer 12 is not left between the edge of the groove 156 and the columnar body 14, and a part of the sacrificial film 34 is left. As a result, as shown in FIG. 24, in the section F in the y direction centered on the columnar body 14 in the groove 156, the sacrificial film 32 is arranged at the height position of the nitride film layer 30, and the sacrificial film 34 is arranged at the height position of the oxide film layer 12 on the side wall of the columnar body 14. Therefore, the sacrificial film 32 and the sacrificial film 34 are exposed in the x direction in the groove 156. On the other hand, the sacrificial film 32 is sandwiched between the nitride film layer 30 and the columnar body 14 in the section G in the x direction centered on the columnar body 14. The sacrificial film 34 is sandwiched between the oxide film layer 12 and the columnar body 14. Therefore, as shown in FIG. 25, the sacrificial film 32 and the sacrificial film 34 are not exposed in the y direction in the section G. The width size of the groove 156 is formed smaller than the diameter of the columnar body 14.

Figure 28:
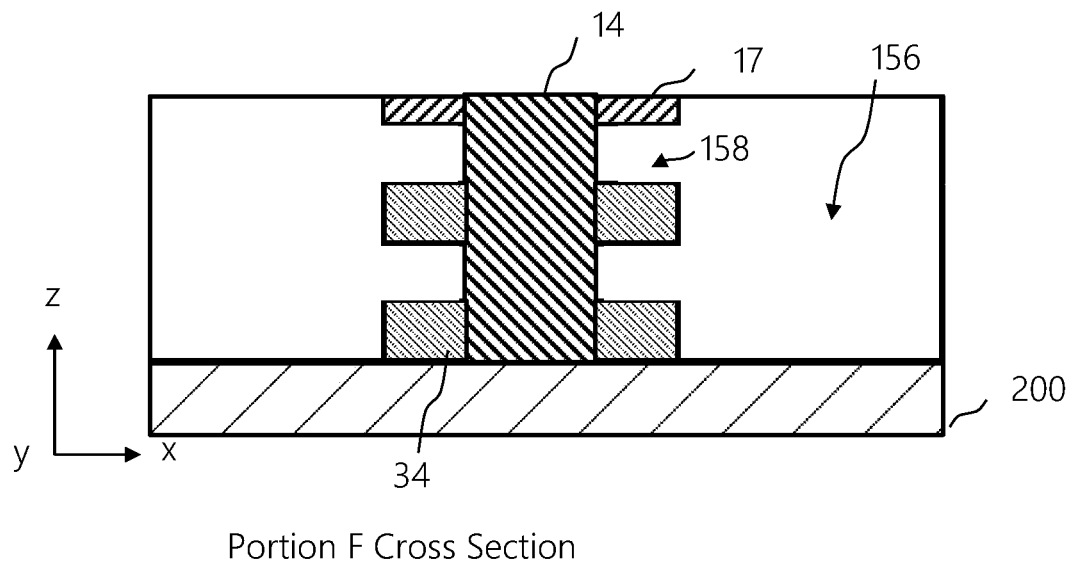
FIG. 28 is a cross-sectional view showing another part of the steps of the method for fabricating the semiconductor device according to the first embodiment.
Figure 29:
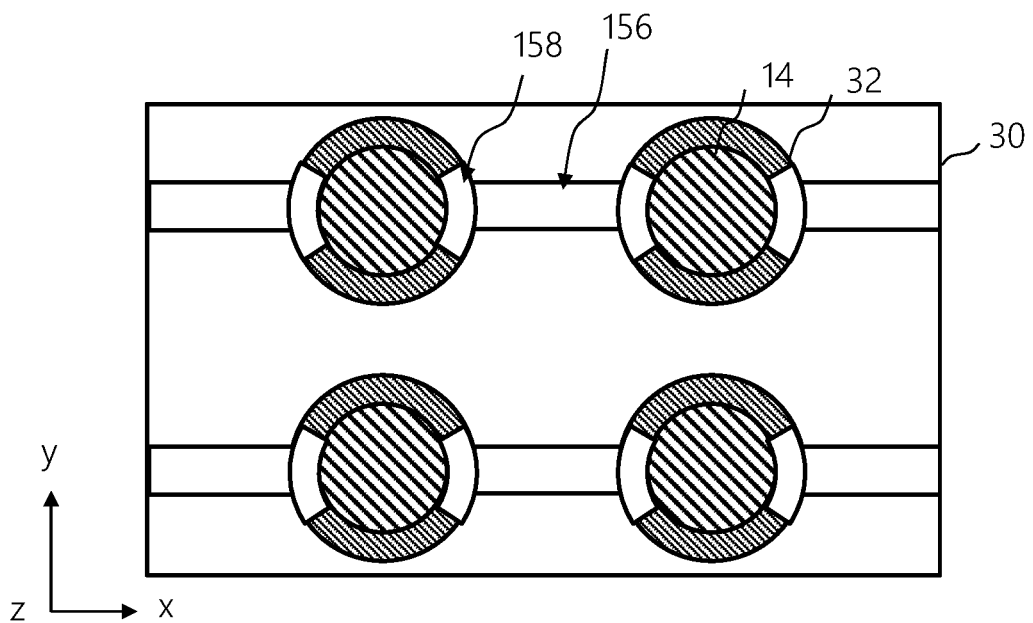
FIG. 29 is a top view showing another part of the steps of the method for fabricating the semiconductor device according to the first embodiment.

FIG. 28 is a cross-sectional view showing another part of the steps of the method for fabricating the semiconductor device according to the first embodiment. FIG. 29 is a top view showing another part of the steps of the method for fabricating the semiconductor device according to the first embodiment. FIGS. 28 and 29 show the film B recess formation step (S118) in FIG. 7. The subsequent steps will be described later. FIG. 29 is a top view of the nitride film layer 30. A top view of the oxide film layer 12 is the same as FIG. 27.

In FIGS. 28 and 29, as the film B recess formation step (S118), a part of the exposed sacrificial film 32 of each nitride film layer 30 in the stacked film is removed via the groove 156. For example, removal is performed by a wet etching method using sulfuric acid ($H_2SO_4$). As a result, the recess 158 is formed in a region between the groove 156 and the columnar body 14 at the height position of each nitride film layer 30 in the stacked film. As shown in FIG. 29, the recess 158 is formed not in the entire sacrificial film 32 but in a portion in the x direction from the end portion to the columnar body 14 with a width slightly larger than the width of the groove 156. For this, a part of the sacrificial film 32 is removed such that the sacrificial film 32 remains on both sides of the columnar body 14 in the y direction.

Figure 30:
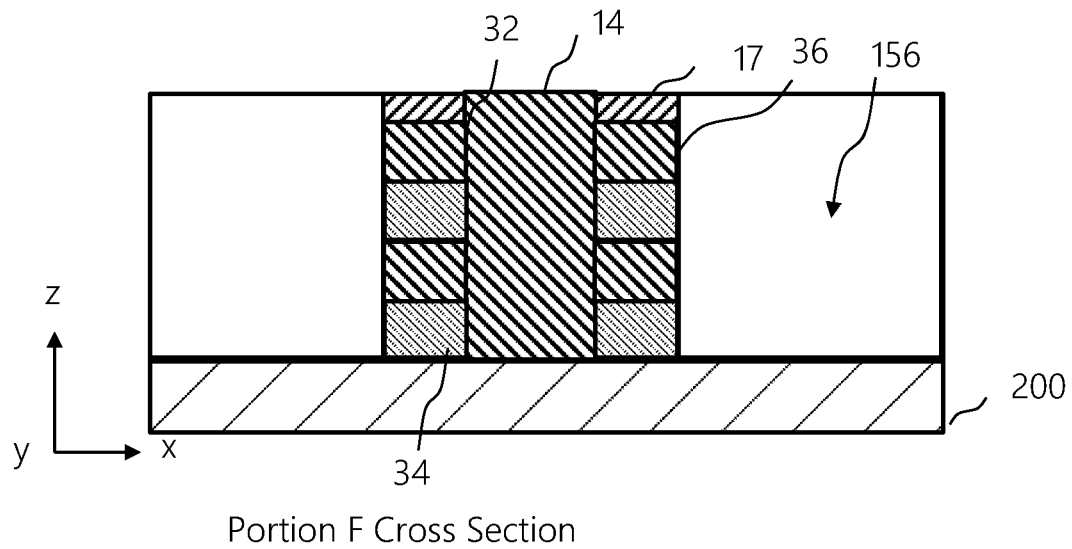
FIG. 30 is a cross-sectional view showing another part of the steps of the method for fabricating the semiconductor device according to the first embodiment.
Figure 31:
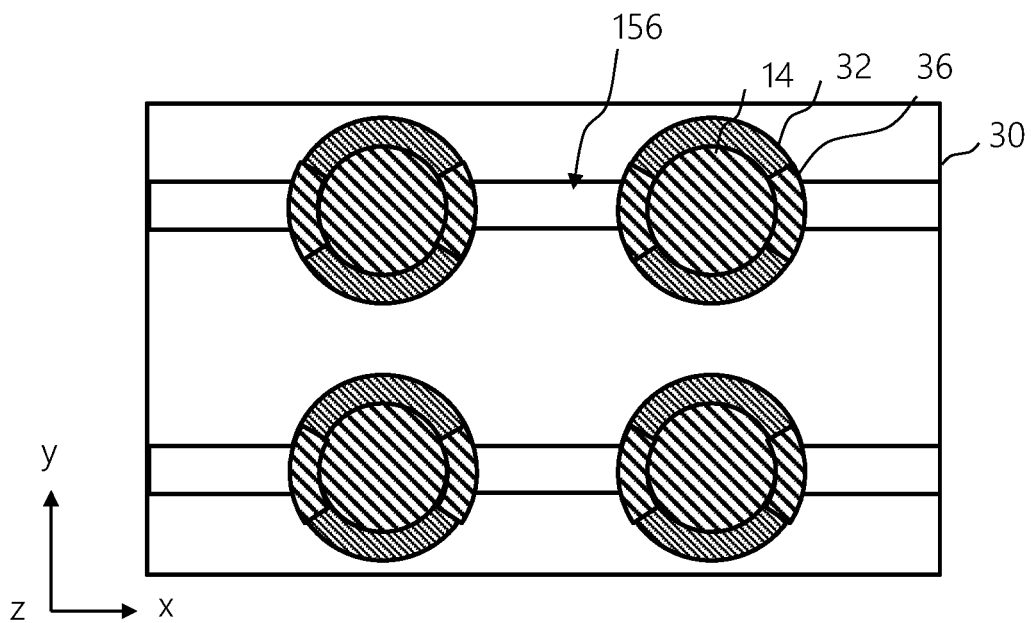
FIG. 31 is a top view showing another part of the steps of the method for fabricating the semiconductor device according to the first embodiment.

FIG. 30 is a cross-sectional view showing another part of the steps of the method for fabricating the semiconductor device according to the first embodiment. FIG. 31 is a top view showing another part of the steps of the method for fabricating the semiconductor device according to the first embodiment. FIGS. 30 and 31 show the columnar body film selective growth step (S120) in FIG. 7. The subsequent steps will be described later. FIG. 31 is a top view of the nitride film layer 30. A top view of the oxide film layer 12 is the same as FIG. 27.

In FIGS. 30 and 31, as the columnar body film selective growth step (S120), a film of the same kind as the columnar body 14 is selectively grown with the wall face of the columnar body 14 as a starting point in the space of the recess 158 where the columnar body 14 is exposed, via the groove 156 by a CVD method. As a result, a growth film 36 is formed in the space of the recess 158.

Figure 32:
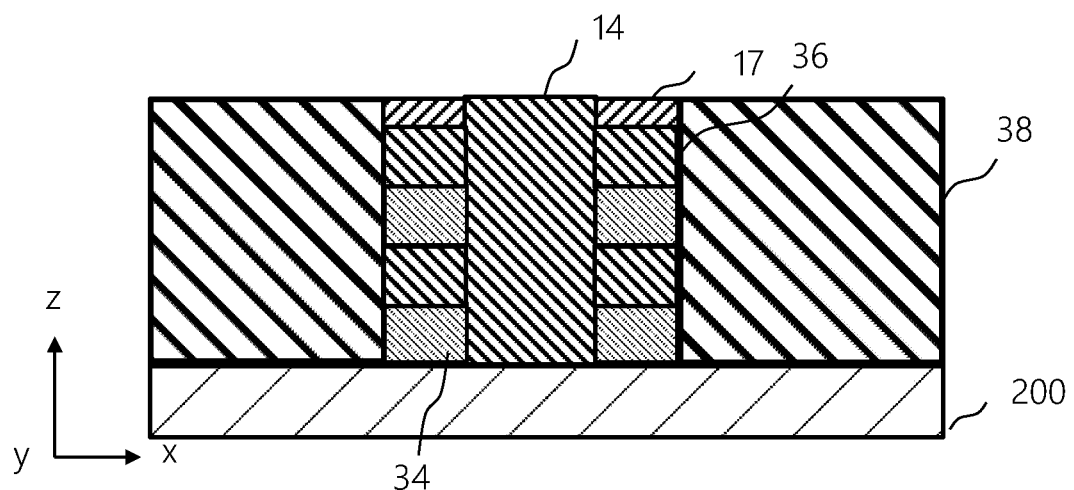
FIG. 32 is a cross-sectional view showing another part of the steps of the method for fabricating the semiconductor device according to the first embodiment.
Figure 33:
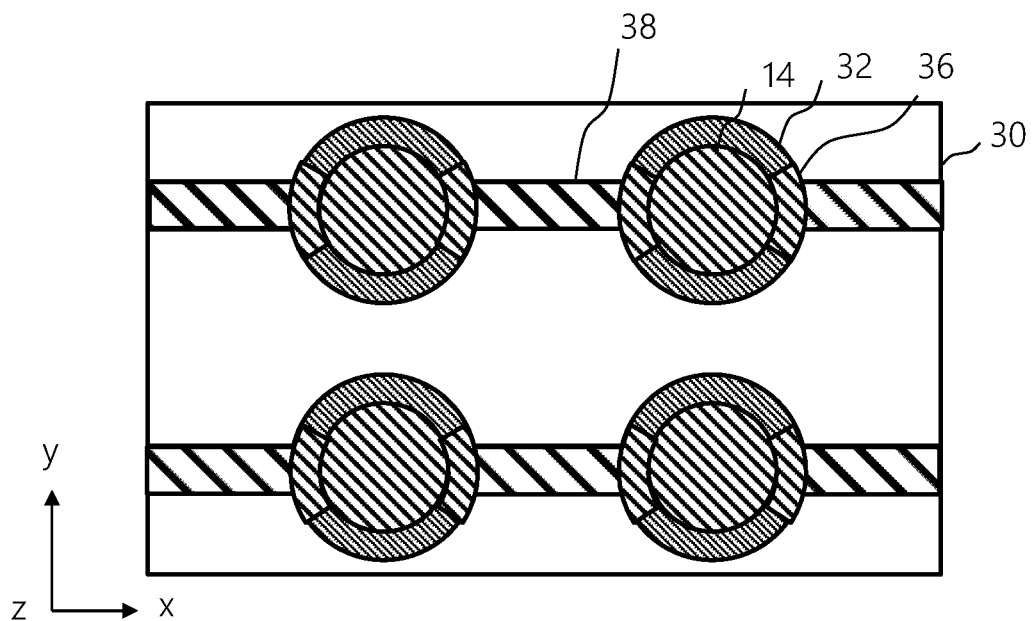
FIG. 33 is a top view showing another part of the steps of the method for fabricating the semiconductor device according to the first embodiment.
Figure 34:
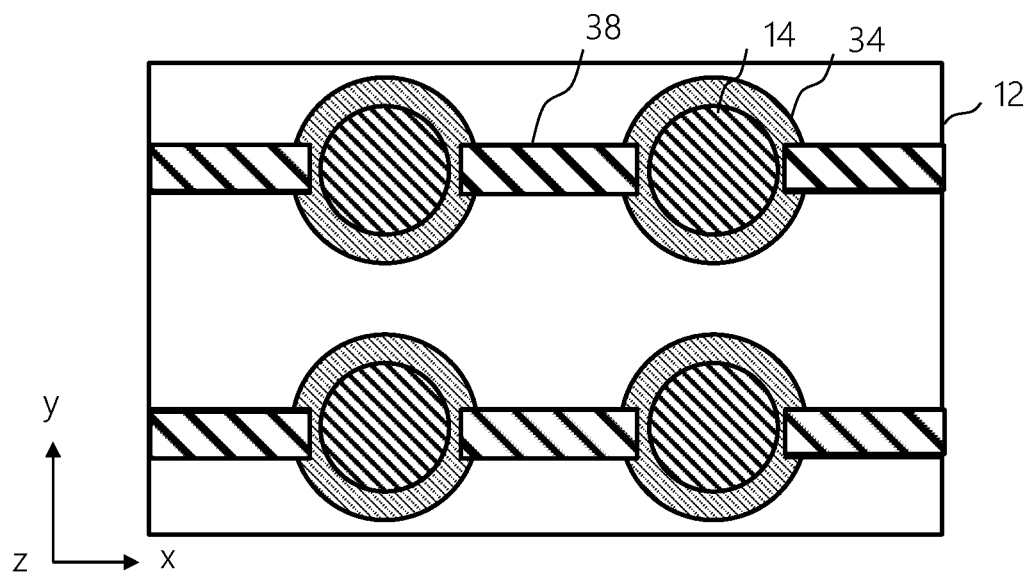
FIG. 34 is a top view showing another part of the steps of the method for fabricating the semiconductor device according to the first embodiment.

FIG. 32 is a cross-sectional view showing another part of the steps of the method for fabricating the semiconductor device according to the first embodiment. FIG. 33 is a top view showing another part of the steps of the method for fabricating the semiconductor device according to the first embodiment. FIG. 34 is a top view showing another part of the steps of the method for fabricating the semiconductor device according to the first embodiment. FIGS. 32 to 34 show the film D embedding step (S122) of FIG. 7. The subsequent steps will be described later. FIG. 33 is a top view of the nitride film layer 30. FIG. 34 is a top view of the oxide film layer 12.

In FIGS. 32 to 34, as the film D embedding step (S122), a sacrificial film 38 (film D) is embedded in the groove 156 by a CVD method. As a material of the sacrificial film 38, for example two kinds of $SiO_2$ and aluminum oxide ($Al_3O_2$) are preferably used. In this case, first, an $SiO_2$ film is formed on the inner wall and the bottom face of the groove 156, and then the inside of the groove 156 is completely filled with an $Al_3O_2$ film. As a result, the groove 156 is filled with the sacrificial film 38 in both the nitride film layer 30 and the oxide film layer 12.

Figure 35:
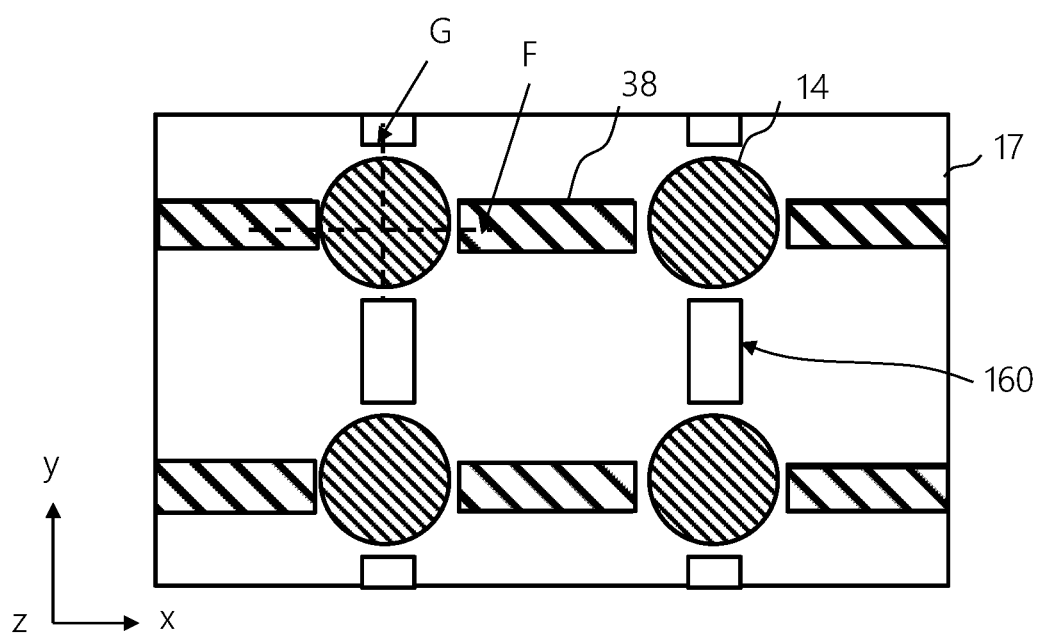
FIG. 35 is a top view showing another part of the steps of the method for fabricating the semiconductor device according to the first embodiment.
Figure 36:
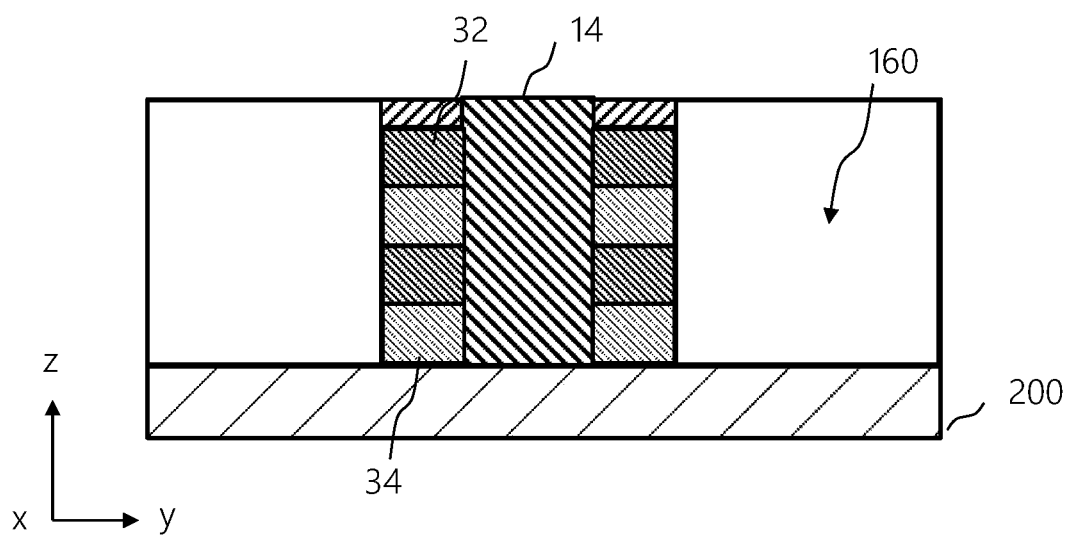
FIG. 36 is a cross-sectional view showing another part of the steps of the method for fabricating the semiconductor device according to the first embodiment.
Figure 37:
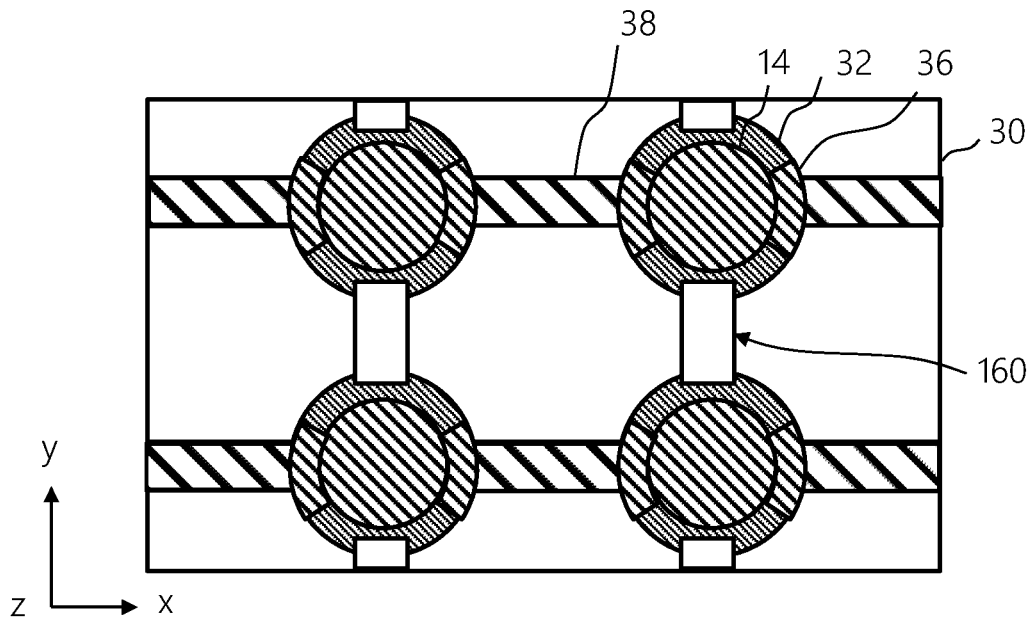
FIG. 37 is a top view showing another part of the steps of the method for fabricating the semiconductor device according to the first embodiment.
Figure 38:
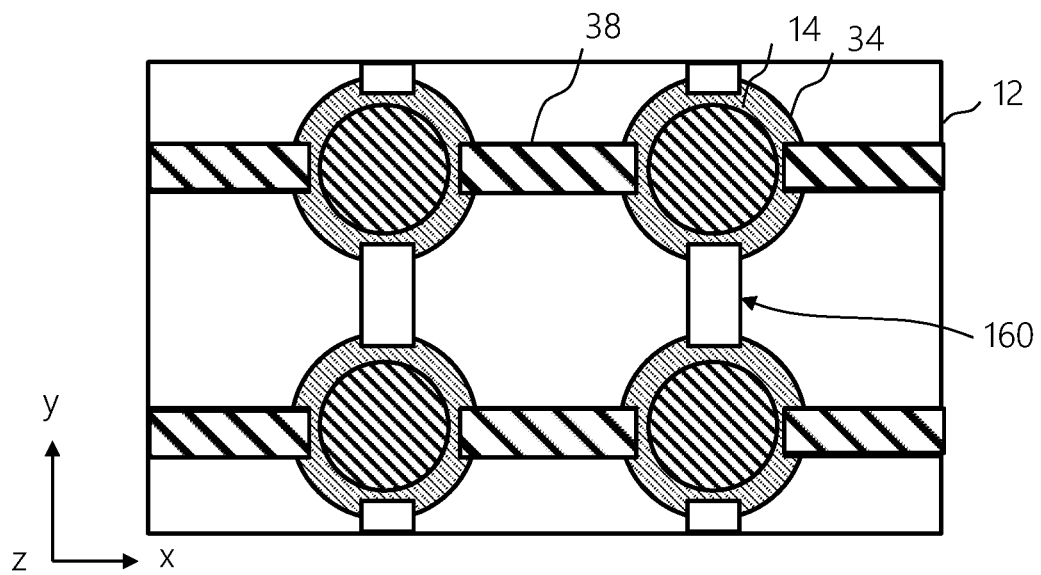
FIG. 38 is a top view showing another part of the steps of the method for fabricating the semiconductor device according to the first embodiment.

FIG. 35 is a top view showing another part of the steps of the method for fabricating the semiconductor device according to the first embodiment. FIG. 36 is a cross-sectional view showing another part of the steps of the method for fabricating the semiconductor device according to the first embodiment. FIG. 37 is a top view showing another part of the steps of the method for fabricating the semiconductor device according to the first embodiment. FIG. 38 is a top view showing another part of the steps of the method for fabricating the semiconductor device according to the first embodiment. FIGS. 35 to 38 show the groove formation step (S124) in FIG. 7. The subsequent steps will be described later. FIG. 35 is a top view of the protective film 17. FIG. 36 shows a cross section of the portion G in FIG. 35 in the x direction centered on the columnar body 14. A cross section of the portion F in FIG. 35 in the y direction centered on the columnar body 14 is the same as FIG. 32. FIG. 37 is a top view of the nitride film layer 30. FIG. 38 is a top view of the oxide film layer 12.

In FIGS. 35 to 38, as the groove formation step (S124), a plurality of grooves 160 (trenches) extending in the y direction are formed between the columnar bodies 14 adjacent in the y direction of the plurality of columnar bodies 14 arranged in an array. As shown in FIG. 35, the plurality of grooves 160 are open from the top of the protective film 17 to the substrate 200 through the stacked film. In the nitride film layer 30, as shown in FIGS. 36 and 37, each groove 160 reaches a part of the sacrificial film 32 without reaching the columnar body 14. In other words, the nitride film layer 30 is not left between the edge of the groove 160 and the columnar body 14, and a part of the sacrificial film 32 is left. Similarly, in the oxide film layer 12, each groove 160 reaches a part of the sacrificial film 34 without reaching the columnar body 14 as shown in FIGS. 36 and 38. In other words, the oxide film layer 12 is not left between the edge of the groove 160 and the columnar body 14, and a part of the sacrificial film 34 is left. As a result, as shown in FIG. 36, in the section G in the x direction centered on the columnar body 14 in the groove 160, the sacrificial film 32 is arranged at the height position of the nitride film layer 30, and the sacrificial film 34 is arranged at the height position of the oxide film layer 12 on the side wall of the columnar body 14. Therefore, the sacrificial film 32 and the sacrificial film 34 are exposed in the y direction in the groove 160. On the other hand, the sacrificial film 34 is sandwiched between the sacrificial film 38 and the columnar body 14 in the section F in the y direction centered on the columnar body 14, and the sacrificial film 32 and the sacrificial film 34 are not exposed in the x direction in the section F as shown in FIG. 32. The width size of the groove 160 is formed smaller than the diameter of the columnar body 14.

Figure 39:
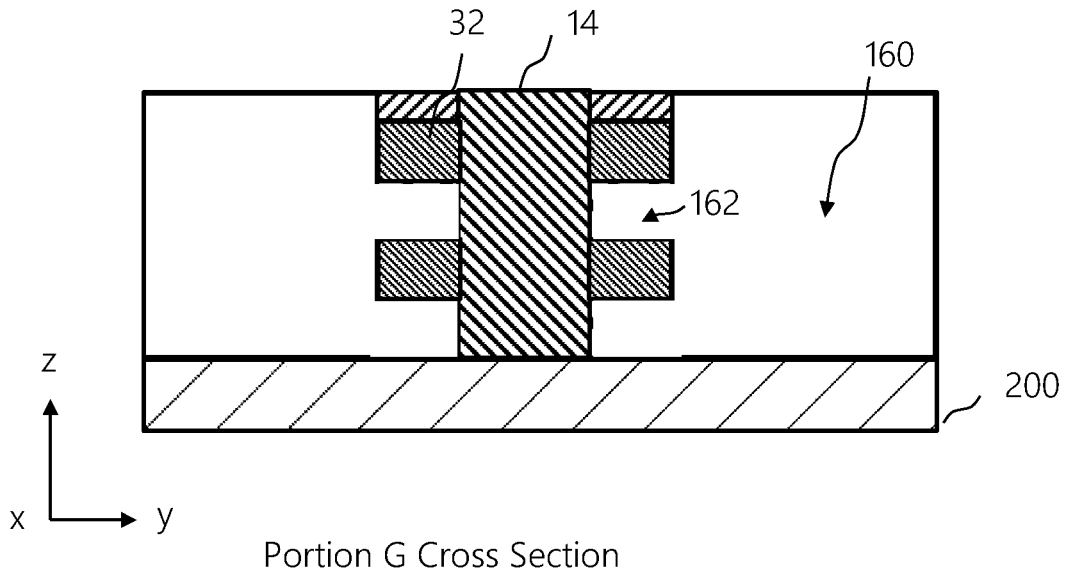
FIG. 39 is a cross-sectional view showing another part of the steps of the method for fabricating the semiconductor device according to the first embodiment.
Figure 40:
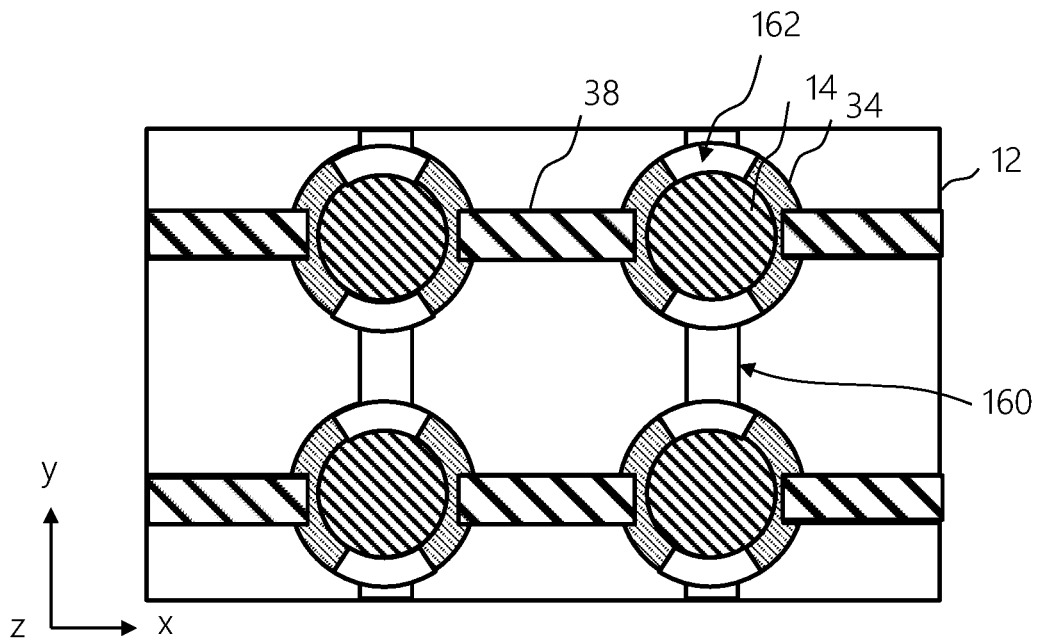
FIG. 40 is a top view showing another part of the steps of the method for fabricating the semiconductor device according to the first embodiment.

FIG. 39 is a cross-sectional view showing another part of the steps of the method for fabricating the semiconductor device according to the first embodiment. FIG. 40 is a top view showing another part of the steps of the method for fabricating the semiconductor device according to the first embodiment. FIGS. 39 and 40 show the film C recess formation step (S126) in FIG. 7. The subsequent steps will be described later. FIG. 40 is a top view of the oxide film layer 12. A top view of the nitride film layer 30 is the same as FIG. 37.

In FIGS. 39 and 40, as the film C recess formation step (S126), a part of the exposed sacrificial film 34 of each oxide film layer 12 in the stacked film is removed via the groove 160. For example, removal is performed by a wet etching method using a mixed acid of sulfuric acid and nitric acid. As a result, a recess 162 is formed in a region between the groove 160 and columnar body 14 at the height position of each oxide film layer 12 in the stacked film. As shown in FIG. 40, the recess 162 is formed not in the entire sacrificial film 34 but in a portion in the y direction from the end portion to the columnar body 14 with a width slightly larger than the width of the groove 160. For this, a part of the sacrificial film 34 is removed such that the sacrificial film 34 remains on both sides of the columnar body 14 in the x direction.

Figure 41:
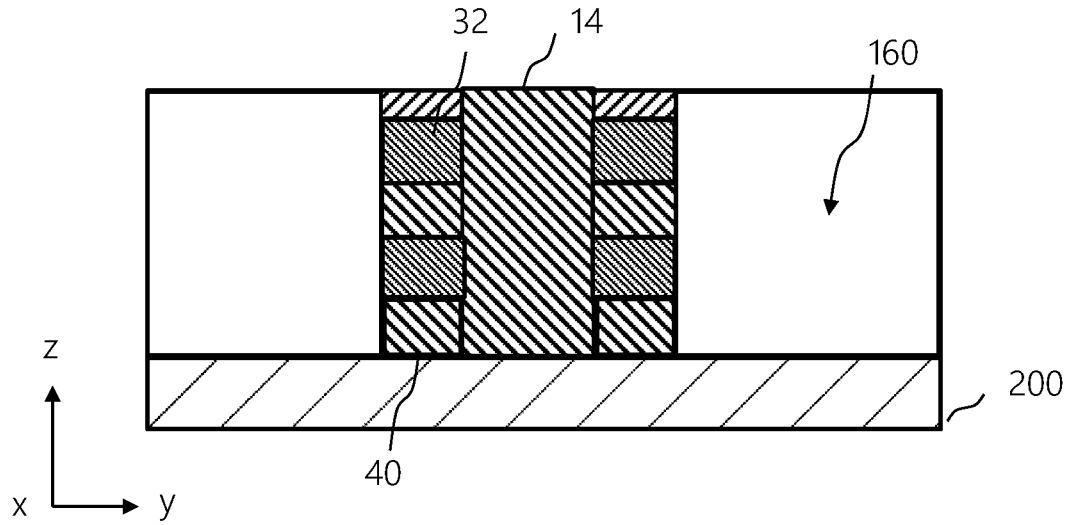
FIG. 41 is a cross-sectional view showing another part of the steps of the method for fabricating the semiconductor device according to the first embodiment.
Figure 42:
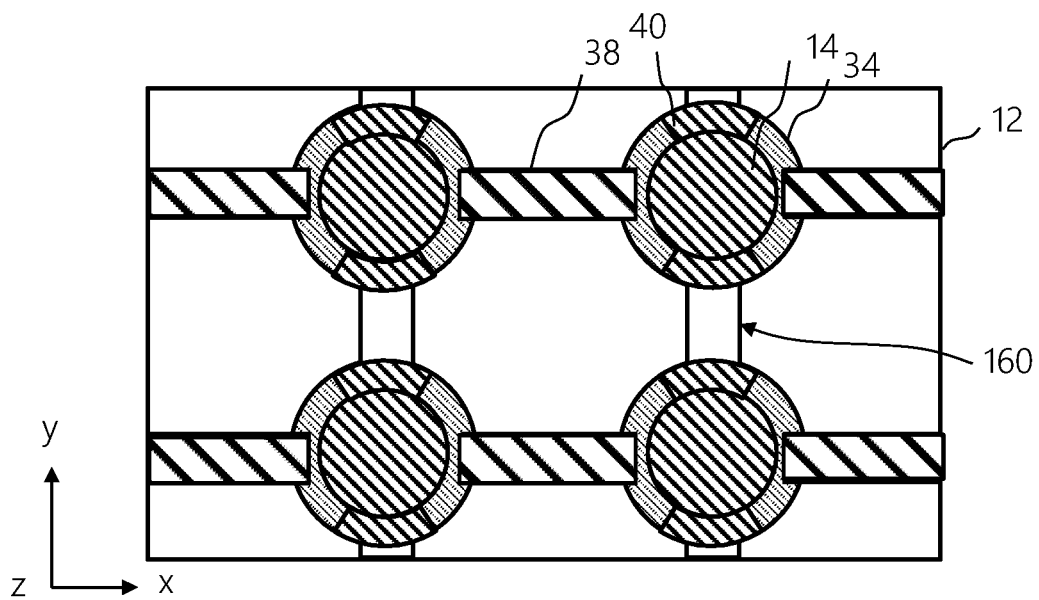
FIG. 42 is a top view showing another part of the steps of the method for fabricating the semiconductor device according to the first embodiment.

FIG. 41 is a cross-sectional view showing another part of the steps of the method for fabricating the semiconductor device according to the first embodiment. FIG. 42 is a top view showing another part of the steps of the method for fabricating the semiconductor device according to the first embodiment. FIGS. 41 and 42 show the columnar body film selective growth step (S128) in FIG. 7. The subsequent steps will be described later. FIG. 42 is a top view of the oxide film layer 12. A top view of the nitride film layer 30 is the same as FIG. 37.

In FIGS. 41 and 42, as the columnar body film selective growth step (S128), a film of the same kind as the columnar body 14 is selectively grown with the wall face of the columnar body 14 as a starting point in the space of the recess 162 where the columnar body 14 is exposed, via the groove 160 by a CVD method. As a result, a growth film 40 is formed in the space of the recess 162.

Figure 43:
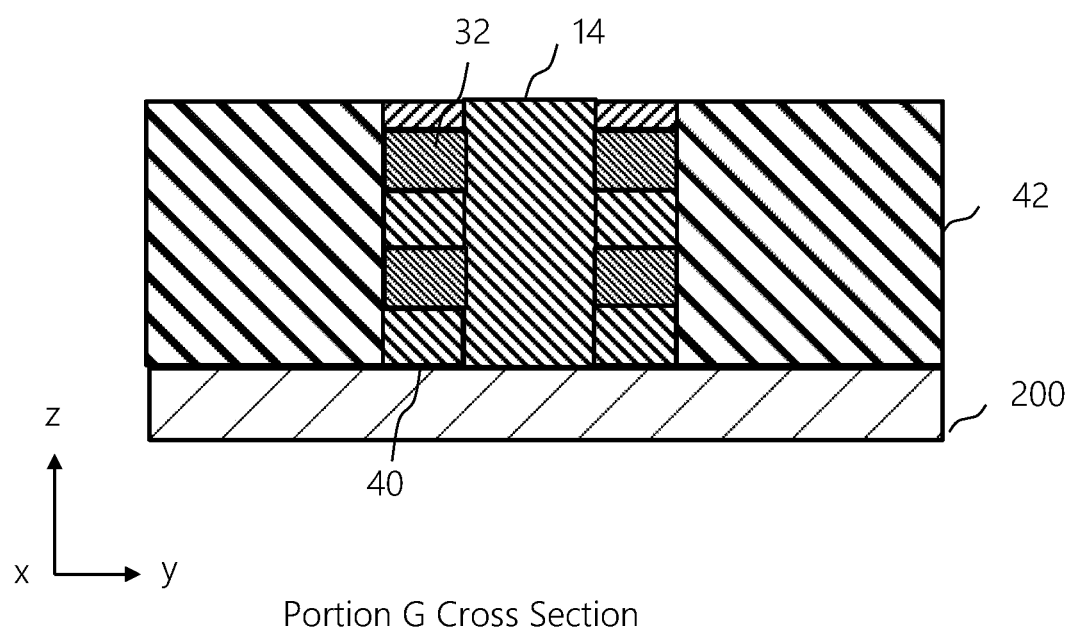
FIG. 43 is a cross-sectional view showing another part of the steps of the method for fabricating the semiconductor device according to the first embodiment.
Figure 44:
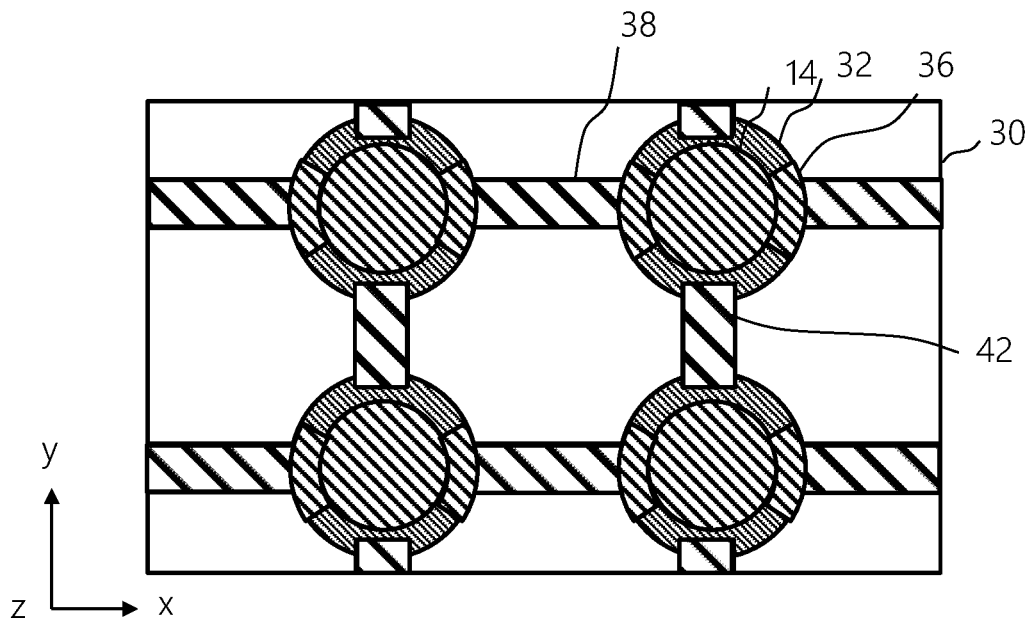
FIG. 44 is a top view showing another part of the steps of the method for fabricating the semiconductor device according to the first embodiment.
Figure 45:
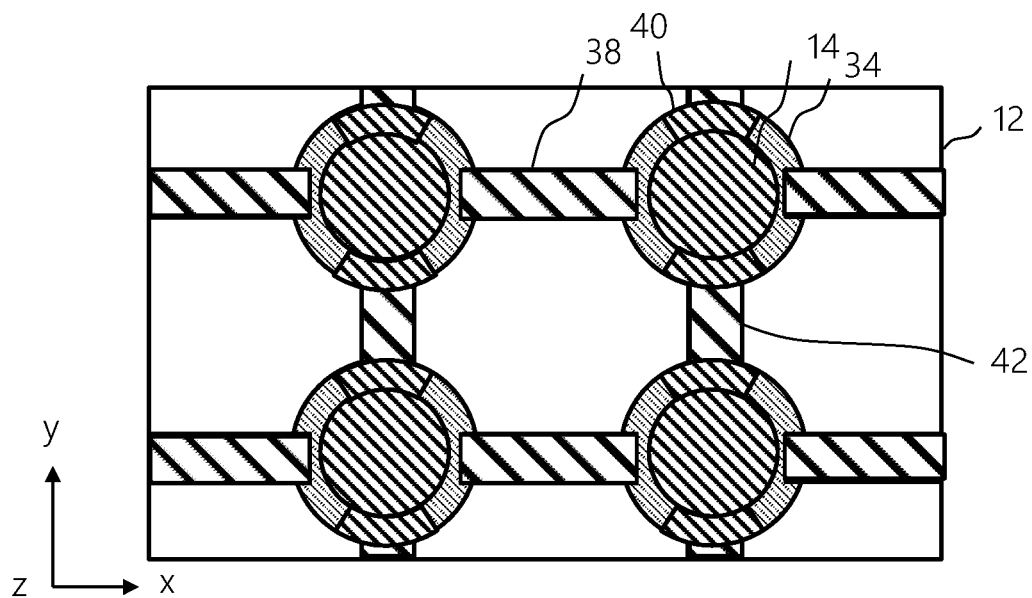
FIG. 45 is a top view showing another part of the steps of the method for fabricating the semiconductor device according to the first embodiment.

FIG. 43 is a cross-sectional view showing another part of the steps of the method for fabricating the semiconductor device according to the first embodiment. FIG. 44 is a top view showing another part of the steps of the method for fabricating the semiconductor device according to the first embodiment. FIG. 45 is a top view showing another part of the steps of the method for fabricating the semiconductor device according to the first embodiment. FIGS. 43 to 45 show the film E embedding step (S130) of FIG. 7. The subsequent steps will be described later. FIG. 44 is a top view of the nitride film layer 30. FIG. 45 is a top view of the oxide film layer 12.

In FIGS. 43 to 45, as the film E embedding step (S130), a sacrificial film 42 (film E) is embedded in the groove 160 by a CVD method. As a material of the sacrificial film 42, for example, two kinds of $SiO_2$ and SiN are preferably used. In this case, first, an $SiO_2$ film is formed on the inner wall and the bottom face of the groove 160, and then the inside of the groove 160 is completely filled with an SiN film. As a result, the groove 160 is filled with the sacrificial film 42 in both the nitride film layer 30 and the oxide film layer 12.

Figure 46:
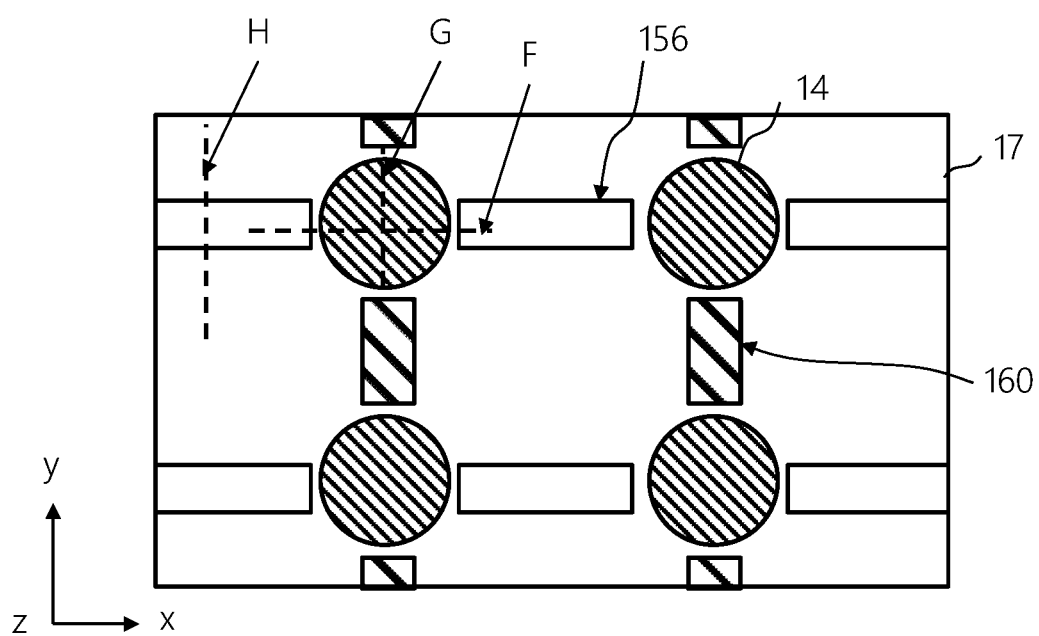
FIG. 46 is a top view showing another part of the steps of the method for fabricating the semiconductor device according to the first embodiment.
Figure 47:
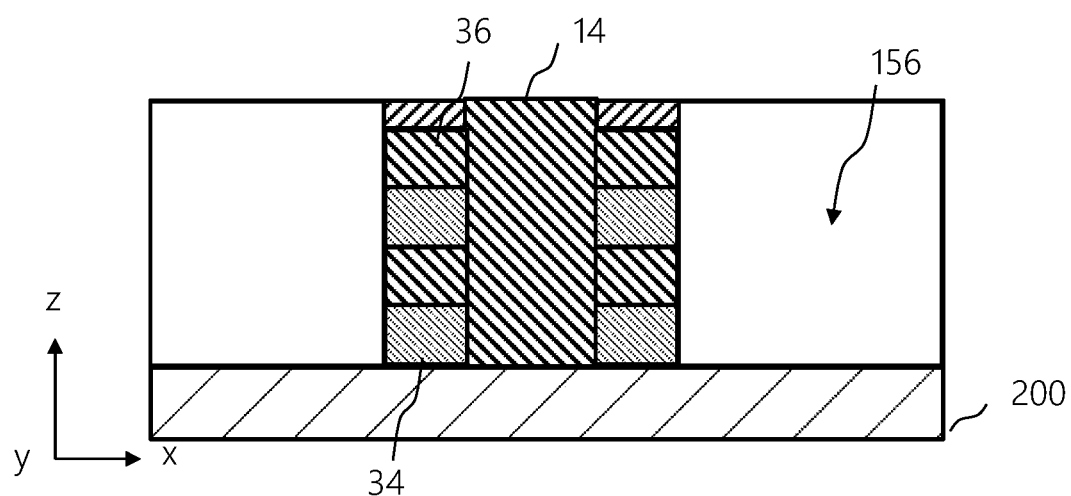
FIG. 47 is a cross-sectional view showing another part of the steps of the method for fabricating the semiconductor device according to the first embodiment.

FIG. 46 is a top view showing another part of the steps of the method for fabricating the semiconductor device according to the first embodiment. FIG. 47 is a cross-sectional view showing another part of the steps of the method for fabricating the semiconductor device according to the first embodiment. FIGS. 46 and 47 show the film D removal step (S132) in FIG. 7. The subsequent steps will be described later. FIG. 46 is a top view of the protective film 17. FIG. 47 shows a cross section of the portion F in FIG. 46 in the y direction centered on the columnar body 14. A cross section of the portion G in FIG. 46 in the x direction centered on the columnar body 14 is the same as FIG. 43.

In FIGS. 46 and 47, as the film D removal step (S132), the sacrificial film 38 embedded in the groove 156 is removed by etching. The sacrificial film 38 is removed for example by a wet etching method. First, the $Al_3O_2$ film is removed by wet etching using nitric acid, and then the $SiO_2$ film is removed by wet etching using hydrofluoric acid. Because the entire groove 156 is not filled with the $SiO_2$ film and is kept to have a uniform film thickness on the inner wall and the bottom face, it is possible to suppress removal of the oxide film layer 12 forming the stacked film in wet etching. This allows the groove 156 to be recovered. In the nitride film layer 30, the growth film 36 is exposed in the groove 156. In the oxide film layer 12, the sacrificial film 34 is exposed.

Figure 48:
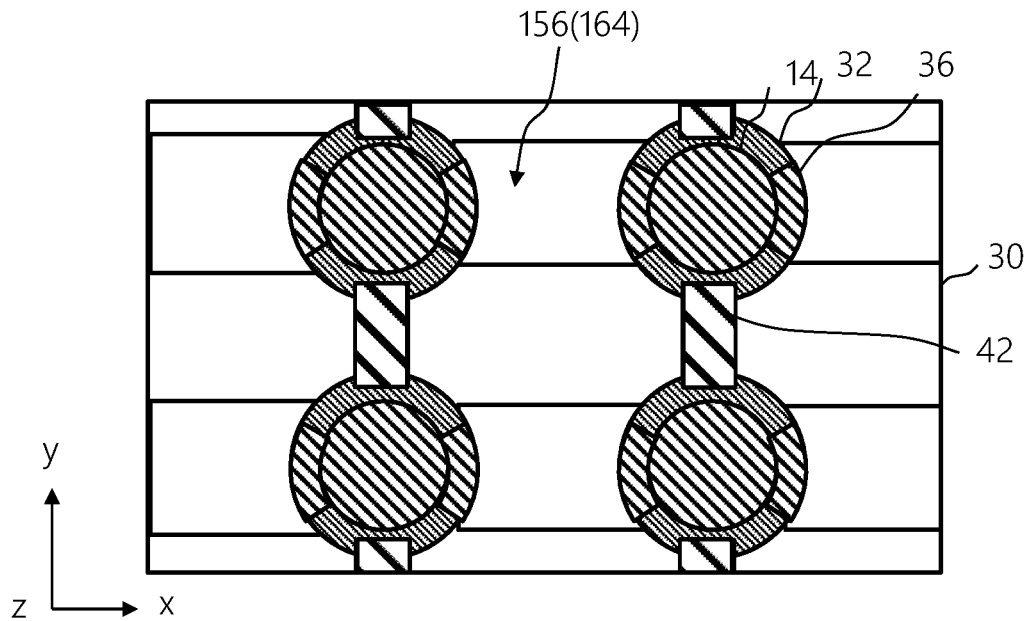
FIG. 48 is a top view showing another part of the steps of the method for fabricating the semiconductor device according to the first embodiment.
Figure 49:
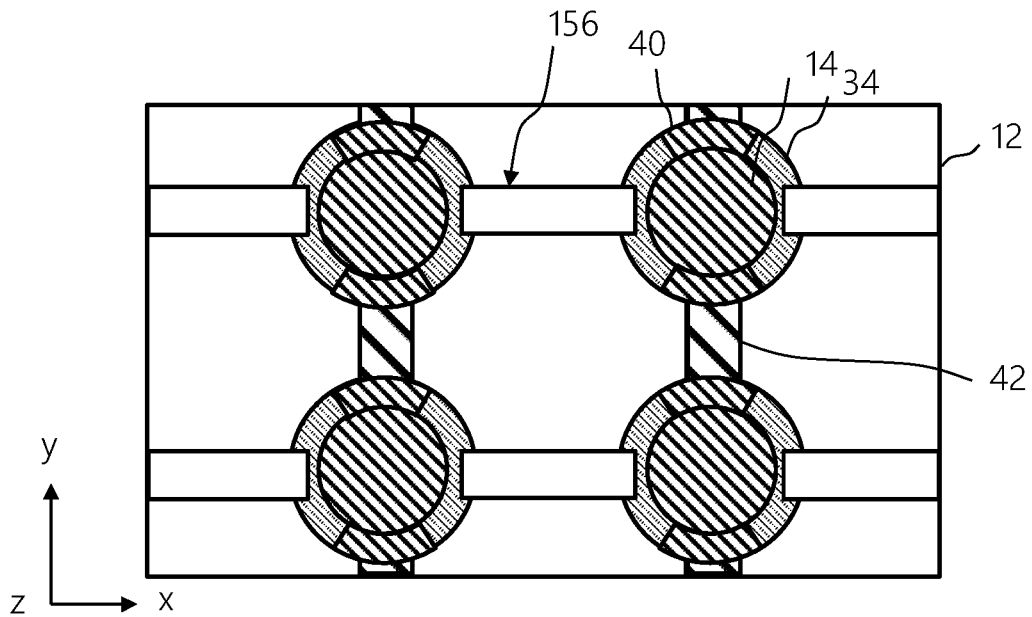
FIG. 49 is a top view showing another part of the steps of the method for fabricating the semiconductor device according to the first embodiment.
Figure 50:
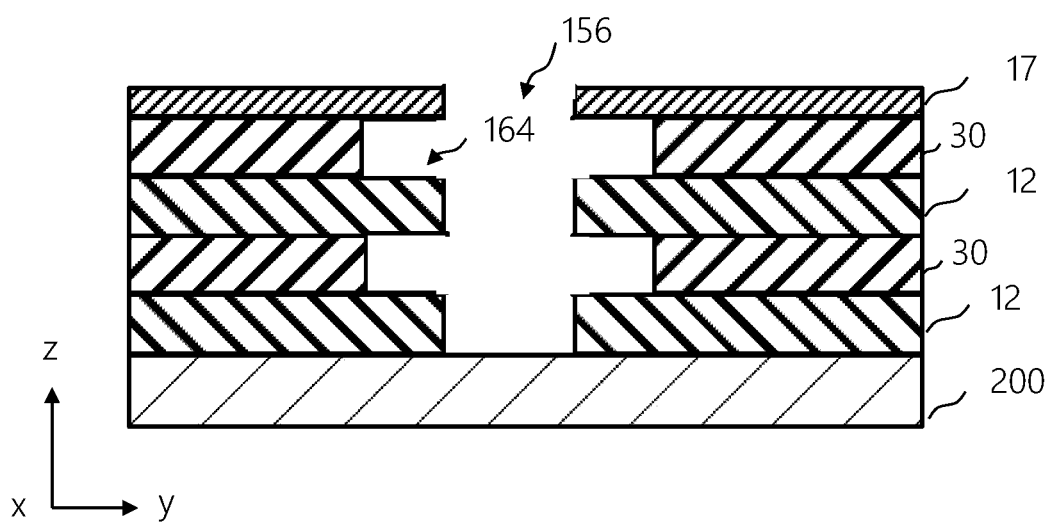
FIG. 50 is a cross-sectional view showing another part of the steps of the method for fabricating the semiconductor device according to the first embodiment.

FIG. 48 is a top view showing another part of the steps of the method for fabricating the semiconductor device according to the first embodiment. FIG. 49 is a top view showing another part of the steps of the method for fabricating the semiconductor device according to the first embodiment. FIG. 50 is a cross-sectional view showing another part of the steps of the method for fabricating the semiconductor device according to the first embodiment. FIGS. 48 to 50 show the film A recess formation step (S134) in FIG. 7. The subsequent steps will be described later. FIG. 48 is a top view of the nitride film layer 30. FIG. 49 is a top view of the oxide film layer 12. FIG. 50 shows a cross section in which the groove 156 is viewed in the x direction (same position as the portion H in FIG. 46).

In FIGS. 48 to 50, as the film A recess formation step (S134), a part of each nitride film layer 30 in the stacked film is removed via the groove 156. For example, removal is performed by a wet etching method using $H_2O$. As a result, as shown in FIG. 50, a recess 164 is formed along the groove 156 at the height position of each nitride film layer 30 in the stacked film. The width of the recess 164 is set to the width of the word line. The width of the opening in each nitride film layer 30 widened by the recess 164 is preferably set to be about the same as the diameter size of the columnar body 14 as shown in FIG. 48. At this time, the recess 164 is formed such that a part of the sacrificial film 32 is exposed. As shown in FIGS. 49 and 50, the recess 164 is not formed in each oxide film layer 12.

Figure 51:
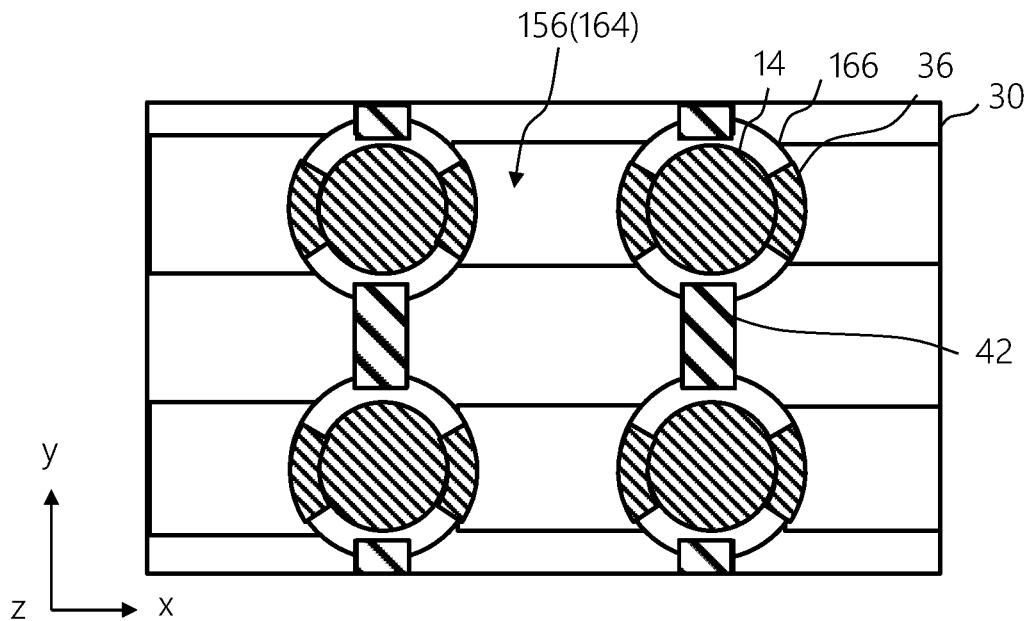
FIG. 51 is a top view showing another part of the steps of the method for fabricating the semiconductor device according to the first embodiment.
Figure 52:
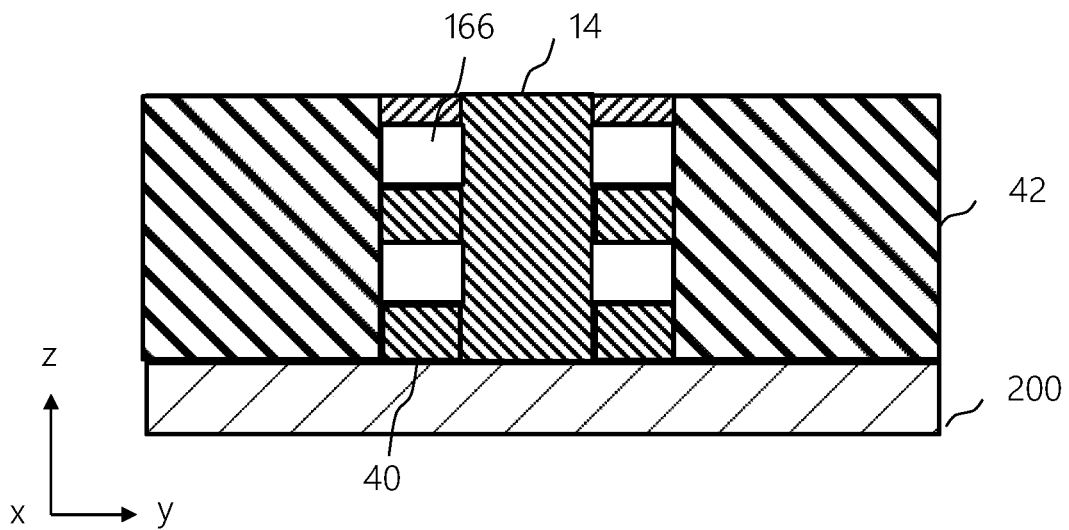
FIG. 52 is a cross-sectional view showing another part of the steps of the method for fabricating the semiconductor device according to the first embodiment.

FIG. 51 is a top view showing another part of the steps of the method for fabricating the semiconductor device according to the first embodiment. FIG. 52 is a cross-sectional view showing another part of the steps of the method for fabricating the semiconductor device according to the first embodiment. FIGS. 51 and 52 show the film B removal step (S136) in FIG. 7. The subsequent steps will be described later. FIG. 51 is a top view of the nitride film layer. A top view of the oxide film layer 12 is the same as FIG. 49. FIG. 52 shows a cross section in the x direction centered on the columnar body 14 (same position as the portion G in FIG. 46).

In FIGS. 51 and 52, as the film B removal step (S136), the sacrificial film 32 located in the nitride film layer 30 is removed via the groove 156 and the recess 164. For example, removal is performed by a wet etching method using sulfuric acid. As a result, an arc-shaped cavity 166 along the outer periphery of the columnar body 14 is formed at the position where the sacrificial film 32 existed.

Figure 53:
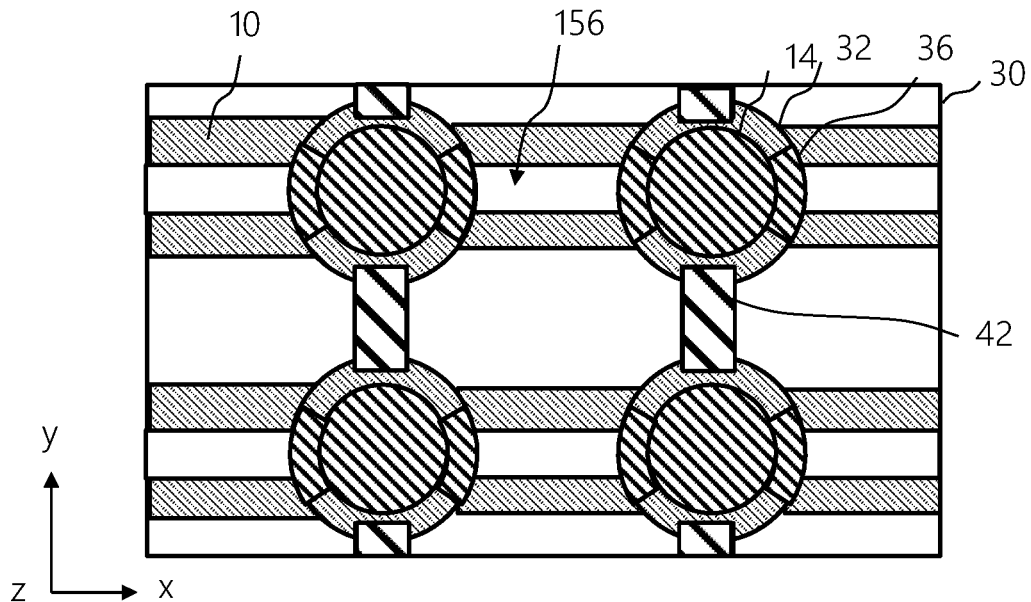
FIG. 53 is a top view showing another part of the steps of the method for fabricating the semiconductor device according to the first embodiment.
Figure 54:
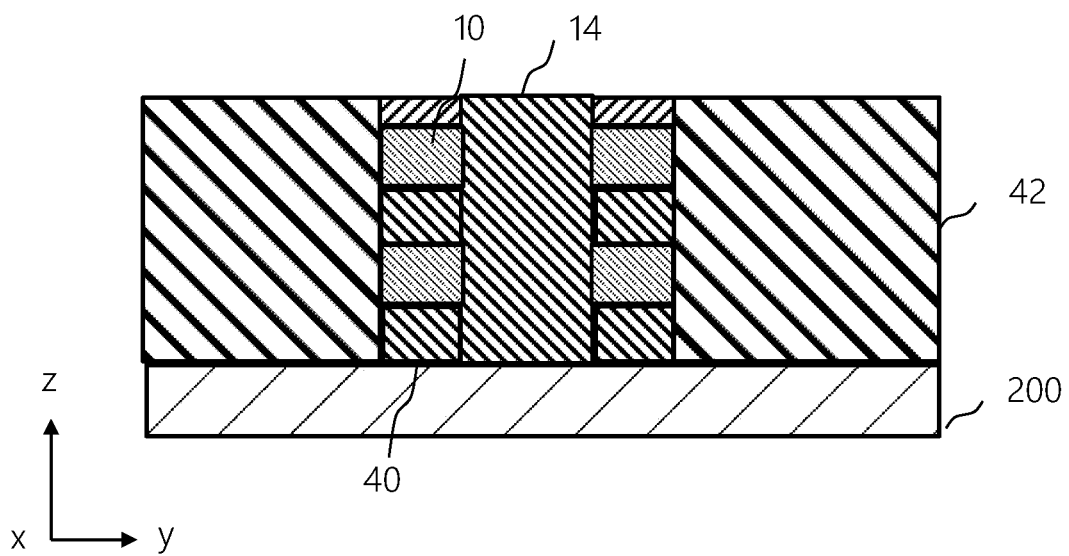
FIG. 54 is a cross-sectional view showing another part of the steps of the method for fabricating the semiconductor device according to the first embodiment.
Figure 55:
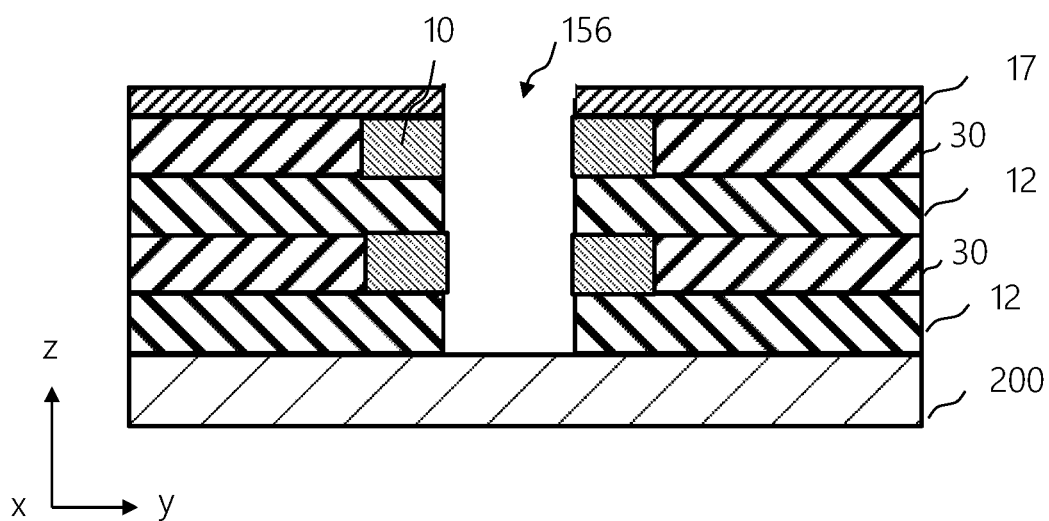
FIG. 55 is a cross-sectional view showing another part of the steps of the method for fabricating the semiconductor device according to the first embodiment.

FIG. 53 is a top view showing another part of the steps of the method for fabricating the semiconductor device according to the first embodiment. FIG. 54 is a cross-sectional view showing another part of the steps of the method for fabricating the semiconductor device according to the first embodiment. FIG. 55 is a cross-sectional view showing another part of the steps of the method for fabricating the semiconductor device according to the first embodiment. FIGS. 53 to 55 show the conductive layer formation step (S138) and the etching step (S140) in FIG. 7. The subsequent steps will be described later. FIG. 53 is a top view of the nitride film layer 30. A top view of the oxide film layer 12 is the same as FIG. 49. FIG. 54 shows a cross section of a portion G in FIG. 46 in the x direction centered on the columnar body 14. FIG. 55 shows a cross section in which the groove 156 is viewed in the x direction (the same position as the portion H in FIG. 46).

In FIGS. 53 to 55, as the conductive layer formation step (S138), the conductive layer 10 is formed in the recess 164 and the cavity 166 via the groove 156 by a CVD method. As a conductive material used for the conductive layer 10, W is preferably used. A barrier metal film (not shown) such as titanium nitride (TiN) is preferably formed around the conductive layer 10.

Next, as the etching step (S140), the excess conductive material on the protective film 17 and on the side wall and the bottom face other than the recess 164 in the groove 156, the material being formed at the time of forming the conductive material, is removed by etching. As a result, the conductive layer 10 extending like a plate in the x direction as shown in FIGS. 53 and 55 and extending in an arc shape with respect to the position of the columnar body 14 as shown in FIGS. 53 and 54 can be formed. Two conductive layers 10 on the same plane formed in the recesses 164 on both side faces of the groove 156 are formed as a pair.

Figure 56:
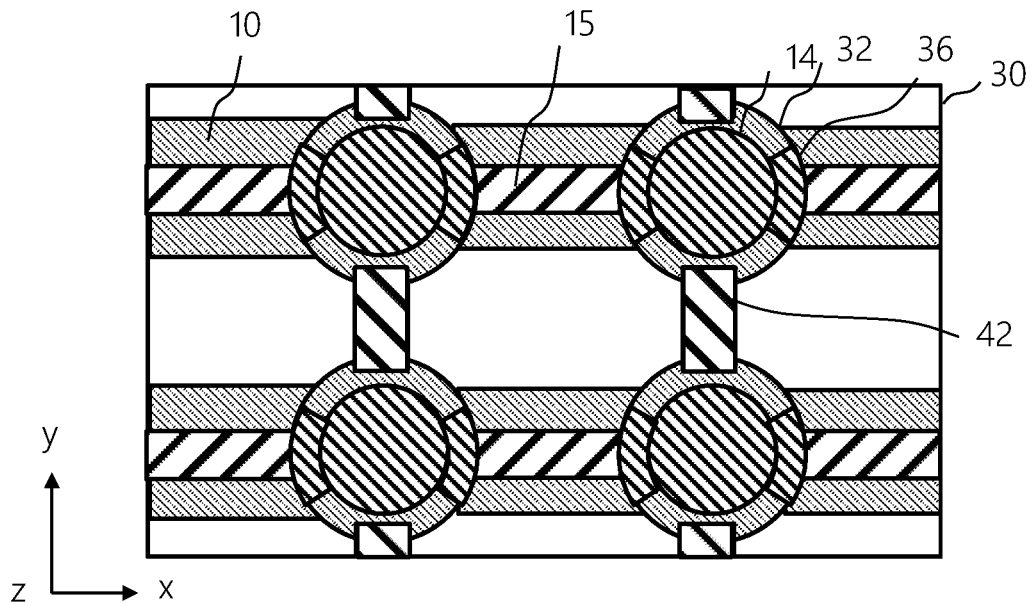
FIG. 56 is a top view showing another part of the steps of the method for fabricating the semiconductor device according to the first embodiment.
Figure 57:
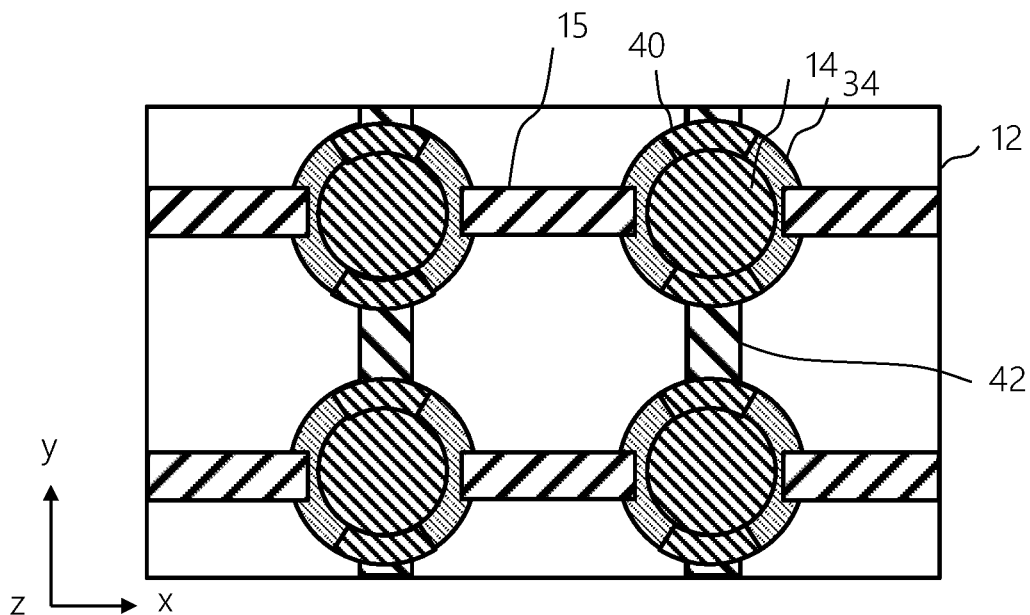
FIG. 57 is a top view showing another part of the steps of the method for fabricating the semiconductor device according to the first embodiment.
Figure 58:
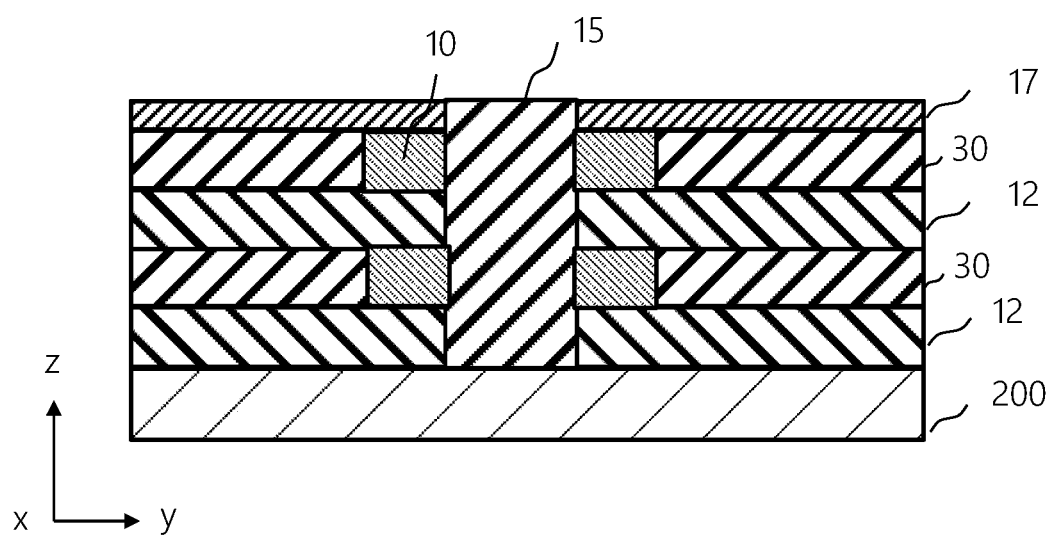
FIG. 58 is a cross-sectional view showing another part of the steps of the method for fabricating the semiconductor device according to the first embodiment.

FIG. 56 is a top view showing another part of the steps of the method for fabricating the semiconductor device according to the first embodiment. FIG. 57 is a top view showing another part of the steps of the method for fabricating the semiconductor device according to the first embodiment. FIG. 58 is a cross-sectional view showing another part of the steps of the method for fabricating the semiconductor device according to the first embodiment. FIGS. 56 to 58 show the dielectric film embedding step (S142) in FIG. 7. The subsequent steps will be described later. FIG. 56 is a top view of the nitride film layer 30. FIG. 57 is a top view of the oxide film layer 12. FIG. 58 shows a cross section in which the position of the groove 156 is viewed in the x direction (the same position as the portion H in FIG. 46).

In FIGS. 56 to 58, as the dielectric film embedding step (S142), the dielectric film 15 is embedded in the groove 156 by a CVD method. As a material of the dielectric film, for example $SiO_2$ is preferably used. As a result, as shown in FIGS. 56 and 58, the space between the two conductive layers 10 forming a pair on the same plane can be filled with the dielectric film 15. As shown in FIGS. 57 and 58, the groove 156 of the oxide film layer 12 is also filled with the dielectric film 15 in the same manner.

Figure 59:
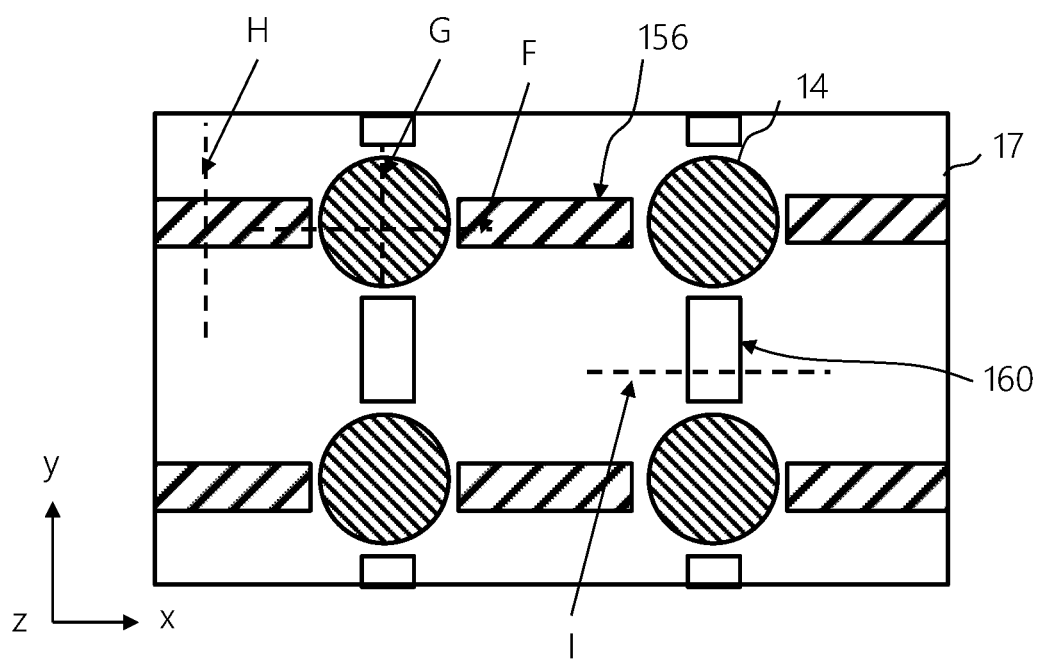
FIG. 59 is a top view showing another part of the steps of the method for fabricating the semiconductor device according to the first embodiment.
Figure 60:
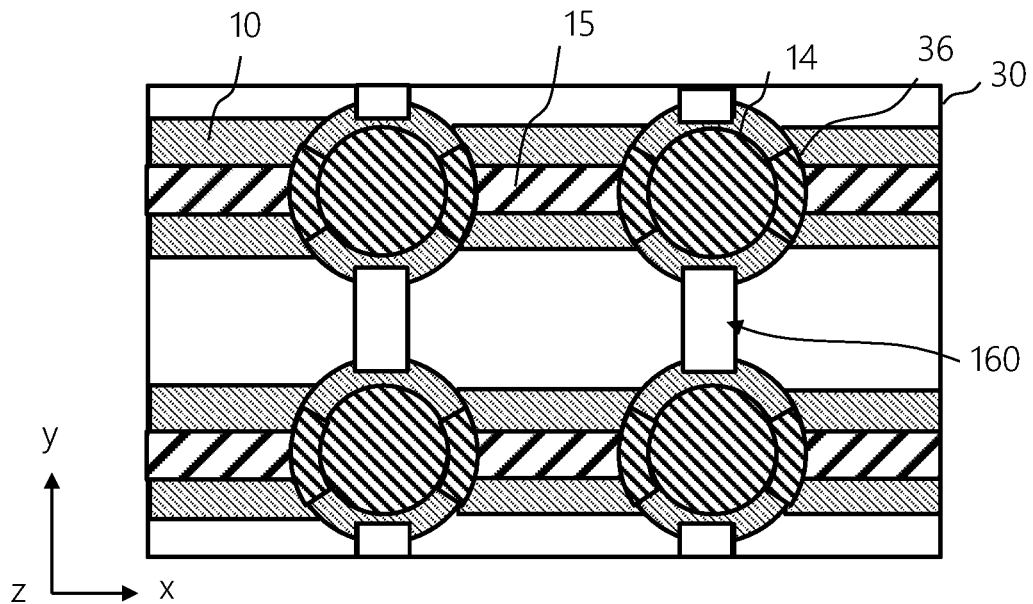
FIG. 60 is a top view showing another part of the steps of the method for fabricating the semiconductor device according to the first embodiment.
Figure 61:
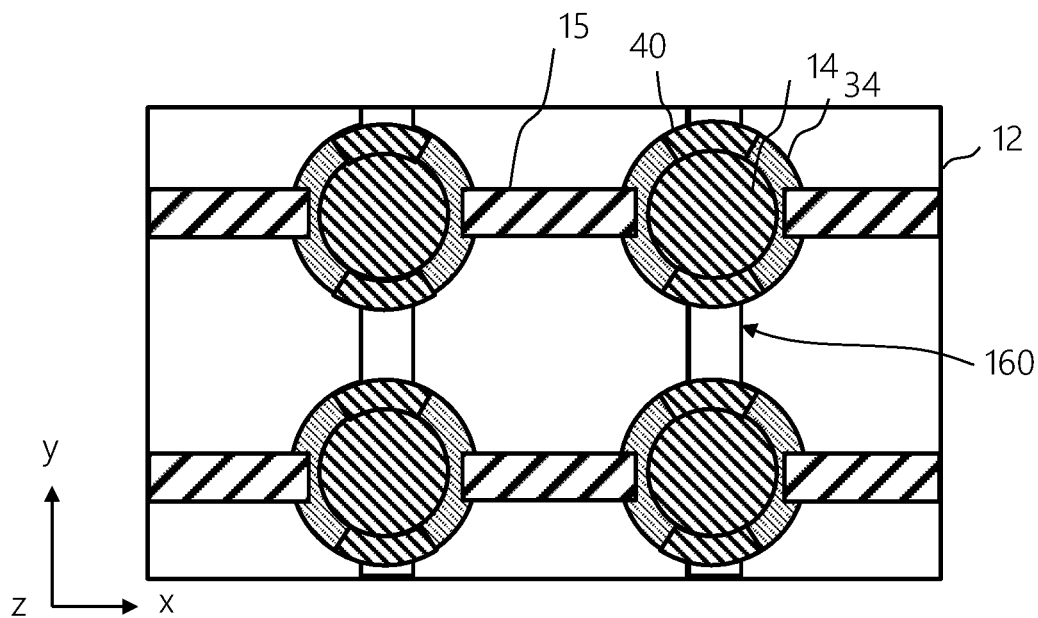
FIG. 61 is a top view showing another part of the steps of the method for fabricating the semiconductor device according to the first embodiment.

FIG. 59 is a top view showing another part of the steps of the method for fabricating the semiconductor device according to the first embodiment. FIG. 60 is a top view showing another part of the steps of the method for fabricating the semiconductor device according to the first embodiment. FIG. 61 is a top view showing another part of the steps of the method for fabricating the semiconductor device according to the first embodiment. FIGS. 59 to 61 show the film E removal step (S144) in FIG. 7. The subsequent steps will be described later. FIG. 59 is a top view of the protective film 17. FIG. 60 is a top view of the nitride film layer 30. FIG. 61 is a top view of the oxide film layer 12.

In FIGS. 59 to 61, as the film E removal step (S144), the sacrificial film 42 formed in the groove 160 is removed. The sacrificial film 42 is removed for example by a wet etching method. First, the SiN film is removed by wet etching using $H_2O$, and then the $SiO_2$ film is removed by wet etching using hydrofluoric acid. Because the entire groove 160 is not filled with the $SiO_2$ film and is kept to have a uniform film thickness on the inner wall and the bottom face, it is possible to suppress removal of the oxide film layer 12 forming the stacked film in wet etching. This allows the groove 160 to be recovered. In the nitride film layer 30, the conductive layer 10 is exposed in the groove 160. In the oxide film layer 12, the growth film 40 is exposed.

Figure 62:
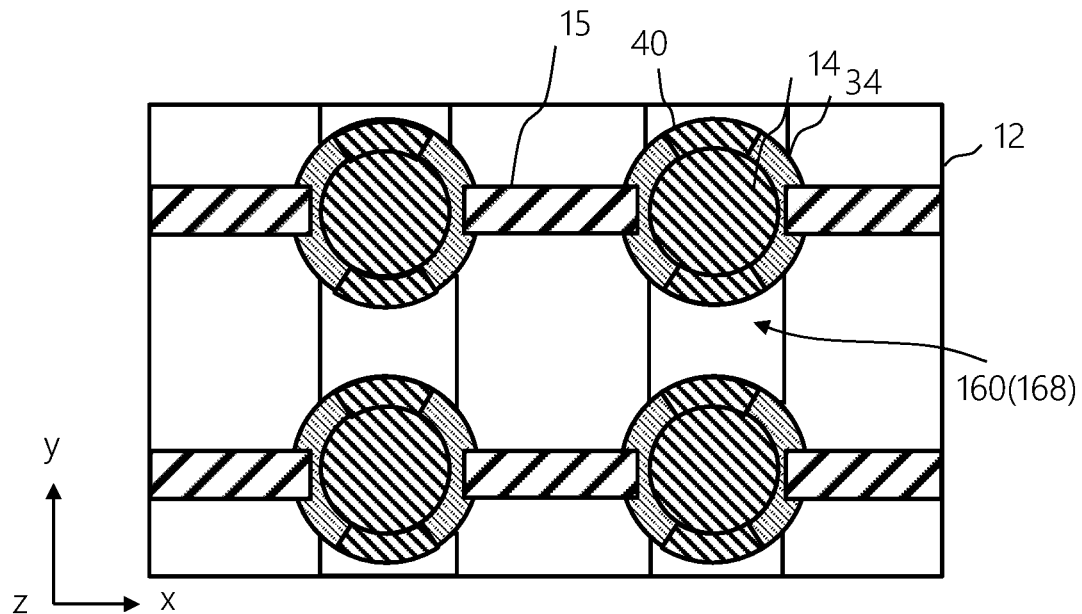
FIG. 62 is a top view showing another part of the steps of the method for fabricating the semiconductor device according to the first embodiment.
Figure 63:
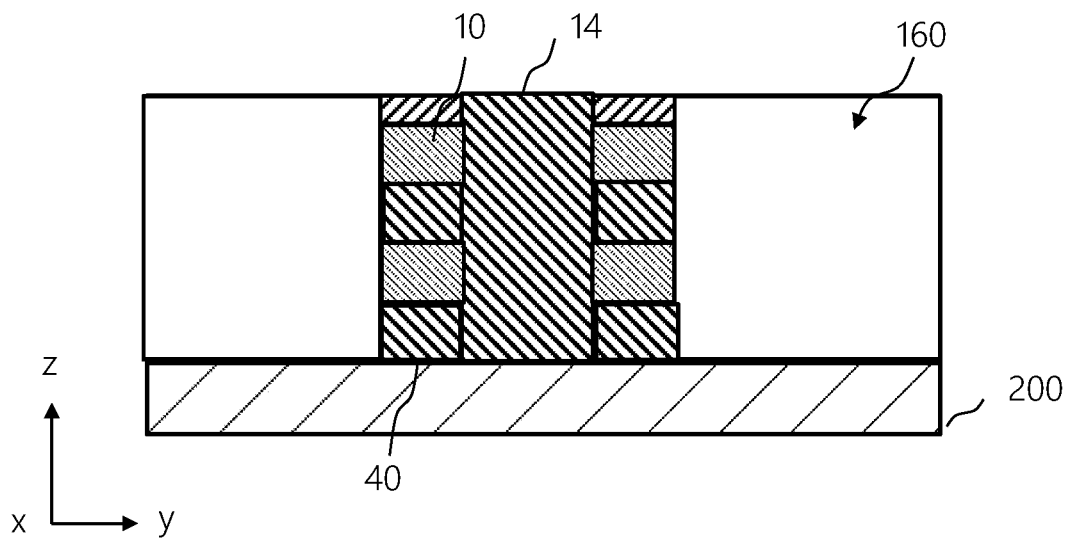
FIG. 63 is a cross-sectional view showing another part of the steps of the method for fabricating the semiconductor device according to the first embodiment.
Figure 64:
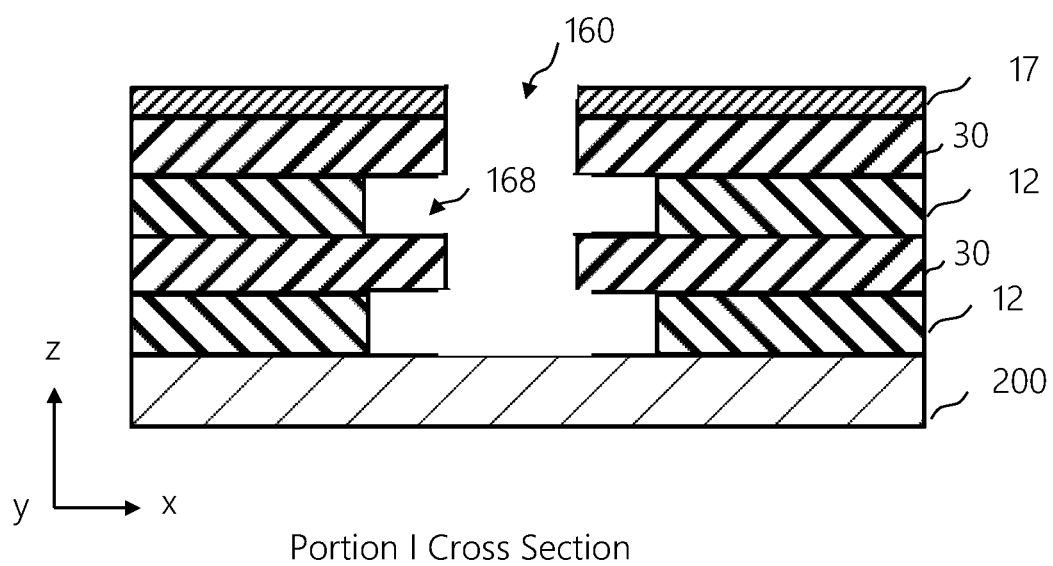
FIG. 64 is a cross-sectional view showing another part of the steps of the method for fabricating the semiconductor device according to the first embodiment.

FIG. 62 is a top view showing another part of the steps of the method for fabricating the semiconductor device according to the first embodiment. FIG. 63 is a cross-sectional view showing another part of the steps of the method for fabricating the semiconductor device according to the first embodiment. FIG. 64 is a cross-sectional view showing another part of the steps of the method for fabricating the semiconductor device according to the first embodiment. FIGS. 62 to 64 show the dielectric film recess formation step (S146) in FIG. 7. The subsequent steps will be described later. FIG. 62 is a top view of the oxide film layer 12. A top view of the sacrificial film layer is the same as FIG. 60. FIG. 63 shows a cross section in the x direction centered on the columnar body 14 (same position as the portion G in FIG. 59). FIG. 64 shows a cross section in which the groove 160 is viewed in the y direction (same position as the portion I in FIG. 59).

In FIGS. 62 to 64, as the dielectric film recess formation step (S146), a part of each oxide film layer 12 in the stacked film is removed via the groove 160. For example, removal is performed by a wet etching method using HF. As a result, as shown in FIG. 64, a recess 168 is formed along the groove 160 at the height position of each oxide film layer 12 in the stacked film. The width of the recess 168 is set to the total width of the line widths of the memory film 20 and the conductive layer 21. The width of the opening in each oxide film layer 12 widened by the recess 168 is preferably set to be about the same as the diameter size of the columnar body 14 as shown in FIG. 62. At this time, the recess 168 is formed such that a part of the sacrificial film 34 is exposed. As shown in FIG. 64, the recess 168 is not formed in each nitride film layer 30.

Figure 65:
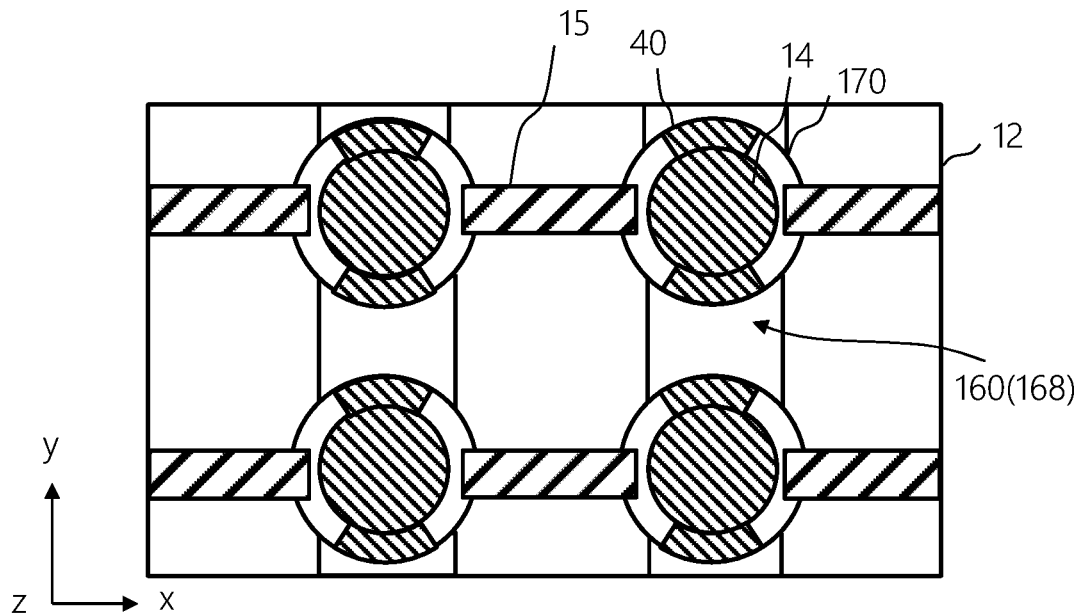
FIG. 65 is a top view showing another part of the steps of the method for fabricating the semiconductor device according to the first embodiment.
Figure 66:
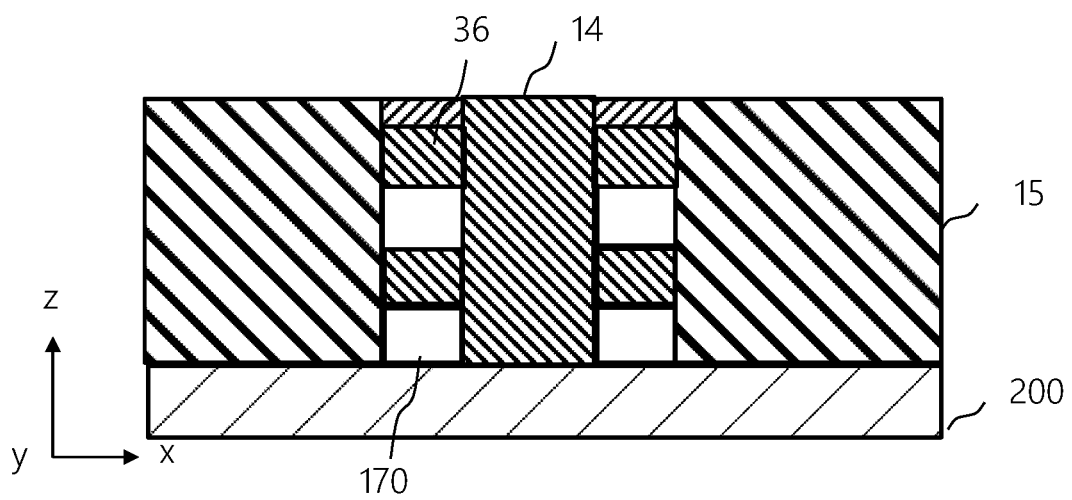
FIG. 66 is a cross-sectional view showing another part of the steps of the method for fabricating the semiconductor device according to the first embodiment.

FIG. 65 is a top view showing another part of the steps of the method for fabricating the semiconductor device according to the first embodiment. FIG. 66 is a cross-sectional view showing another part of the steps of the method for fabricating the semiconductor device according to the first embodiment. FIGS. 65 and 66 show the film C removal step (S148) in FIG. 7. The subsequent steps will be described later. FIG. 65 is a top view of the oxide film layer 12. A top view of the nitride film layer 30 is the same as FIG. 60. FIG. 66 shows a cross section in the y direction centered on the columnar body 14 (same position as the portion F in FIG. 59).

In FIGS. 65 and 66, as the film C removal step (S148), the sacrificial film 34 located in the oxide film layer 12 is removed via the groove 160 and the recess 168. For example, removal is performed by a wet etching method using a mixed acid. As a result, an arc-shaped cavity 170 along the outer periphery of the columnar body 14 is formed at the position where the sacrificial film 34 existed.

Figure 67:
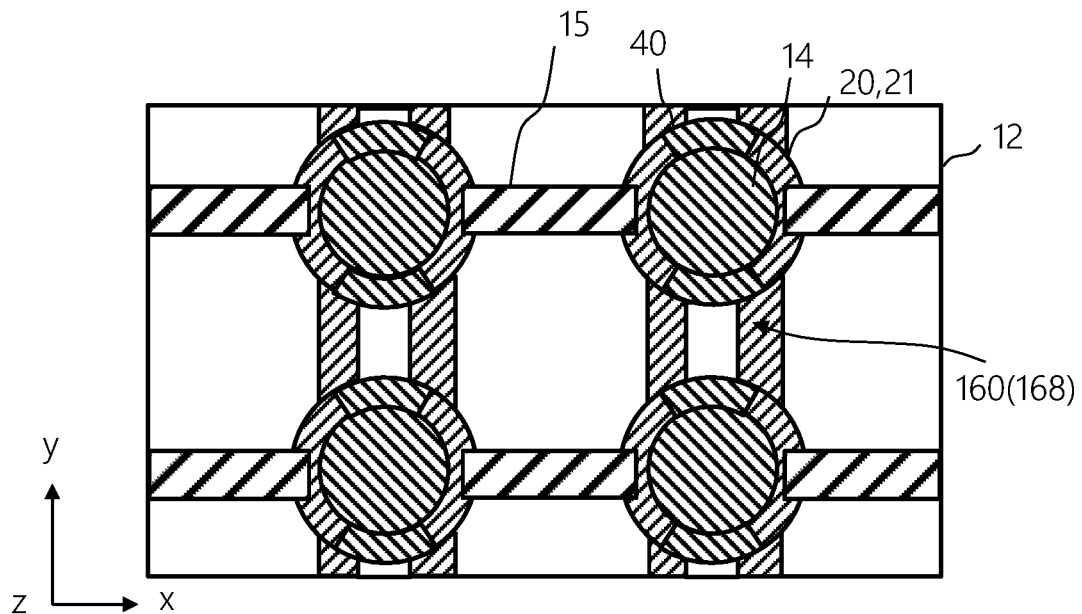
FIG. 67 is a top view showing another part of the steps of the method for fabricating the semiconductor device according to the first embodiment.
Figure 68:
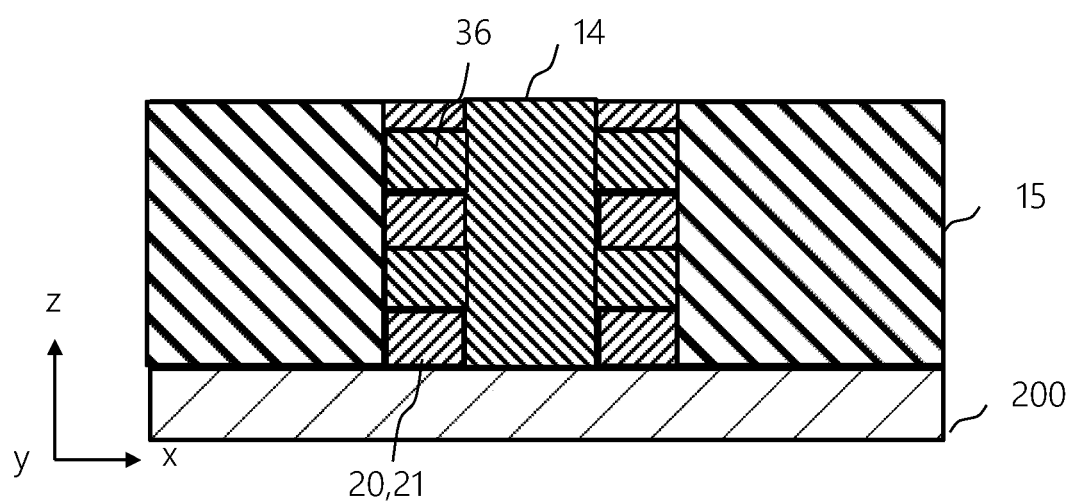
FIG. 68 is a cross-sectional view showing another part of the steps of the method for fabricating the semiconductor device according to the first embodiment.
Figure 69:
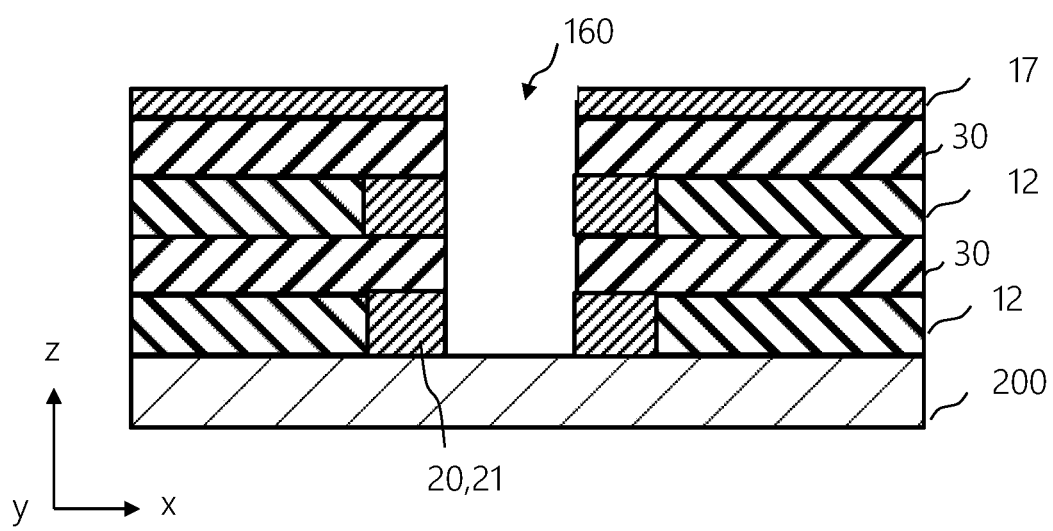
FIG. 69 is a cross-sectional view showing another part of the steps of the method for fabricating the semiconductor device according to the first embodiment.

FIG. 67 is a top view showing another part of the steps of the method for fabricating the semiconductor device according to the first embodiment. FIG. 68 is a cross-sectional view showing another part of the steps of the method for fabricating the semiconductor device according to the first embodiment. FIG. 69 is a cross-sectional view showing another part of the steps of the method for fabricating the semiconductor device according to the first embodiment. FIGS. 67 to 69 show the memory film formation step (S150), the conductive layer formation step (S152), and the etching step (S154) in FIG. 7. The subsequent steps will be described later. FIG. 67 is a top view of the oxide film layer 12. A top view of the nitride film layer 30 is the same as FIG. 60. FIG. 68 shows a cross section in the y direction centered on the columnar body 14 (same position as the portion F in FIG. 59). FIG. 69 shows a cross section in which the groove 160 is viewed in the y direction (same position as the portion I in FIG. 59).

In FIGS. 67 to 69, as the memory film formation step (S150), the memory film 20 is formed on the upper face, the bottom face, and the side wall in the recess 168 and the upper face, the bottom face, and the side wall in the cavity 170 by, for example, an ALD method, an ALCVD method, or a CVD method. In the case of a flash memory device, the memory film 20 includes, for example, a block dielectric film 28, a charge accumulation film 26, and a tunnel dielectric film 24. Hereinafter, the internal process will be specifically described.

As a block film formation step, the block dielectric film 28 is formed on the upper face, the bottom face, and the side wall in each recess 168 and the upper face, the bottom face, and the side wall in the cavity 170 for example by an ALD method, an ALCVD method, or a CVD method. The block dielectric film 28 is a film for preventing charges from flowing between the charge accumulation film 26 and the conductive layer 10. As a material of the block dielectric film 28, for example an $Al_2O_3$ film or an $SiO_2$ film is preferably used. In addition, a high-k film of zirconium oxide ($ZrO_2$), hafnium oxide ($HfO_2$), or the like can be used. As a result, the block dielectric film 28 can be formed as a part of the memory film 20 along the upper face, the bottom face, and the side wall in each recess 168 and the upper face, the bottom face, and the side wall in the cavity 170.

Next, as a charge accumulation film formation step, the charge accumulation film 26 is formed along the upper face, the bottom face, and the side wall in each recess 168, and along the upper face, the bottom face, and the side wall of the block dielectric film 28 on the upper face, the bottom face, and the side wall in the cavity 170, for example by an ALD method, an ALCVD method, or a CVD method. The charge accumulation film 26 is a film containing a material capable of accumulating charges. As a material of the charge accumulation film 26, for example SiN is preferably used. As a result, the charge accumulation film 26 can be formed along the inner face of the block dielectric film 28 as a part of the memory film 20.

Next, as a tunnel dielectric film formation step, the tunnel dielectric film 24 is formed along the upper face, the bottom face, and the side wall in each recess 168 and along the upper face, the bottom face, and the side wall of the charge accumulation film 26 on the upper face, the bottom face, and the side wall in the cavity 170, for example by, an ALD method, an ALCVD method, or a CVD method. The tunnel dielectric film 24 is a dielectric film that has a dielectric property and allows a current to flow by application of a predetermined voltage. As a material of the tunnel dielectric film 24, for example $SiO_2$ is preferably used. As a result, the tunnel dielectric film 24 can be formed along the inner face of the charge accumulation film 26 as a part of the memory film 20.

As the conductive layer formation step (S152), the conductive layer 21 is formed like a plate along the upper face, the bottom face, and the side wall in each recess 168, and along the upper face, the bottom face, and the side wall of the tunnel dielectric film 24 on the upper face, the bottom face, and the side wall in the cavity 170, for example by an ALD method, an ALCVD method, or a CVD method. When the conductive layer 21 functions as a channel film, a semiconductor material is used as a material of the conductive layer 21. For example, silicon (Si) is preferably used. As a result, the conductive layer 21 having a plate shape can be formed along the memory film 20, here, particularly, the inner face of the tunnel dielectric film 24.

As a result, as shown in FIG. 2, the memory film 20 is arranged in such a manner as to surround the conductive layer 21 in the cavity 170. Specifically, the tunnel dielectric film 24 is arranged in such a manner as to surround the conductive layer 21. Then, the charge accumulation film 26 is arranged in such a manner as to surround the tunnel dielectric film 24. Then, the block dielectric film 28 is arranged in such a manner as to surround the charge accumulation film 26.

As the etching step (S154), the excess conductive layer 21 formed on the side wall and the bottom face of the groove 160 and on the protective film 17 other than the recess 168 is removed by etching. For example, removal is performed by a wet etching method using a choline solution. Thereafter, in the same manner, the excess memory film 20 formed on the side wall and the bottom face of the groove 160 and on the protective film 17 other than the recess 168 is removed by etching. In the memory film 20, the $Al_3O_2$ or $SiO_2$ film is removed by wet etching with hydrofluoric acid, and the SiN film is removed by wet etching with $H_2O$. As a result, the conductive layer 21 and the memory film 20 extending like a plate in the y direction as shown in FIGS. 67 and 69 and extending in an arc shape with respect to the position of the columnar body 14 as shown in FIGS. 67 and 68 can be formed. Further, two conductive layers 21 formed in the recesses 168 on both side faces of the groove 160 are formed as a pair. In each conductive layer 21, the upper face, the bottom face, and at least one of both side faces on a same plane is covered with the memory film 20.

Figure 70:
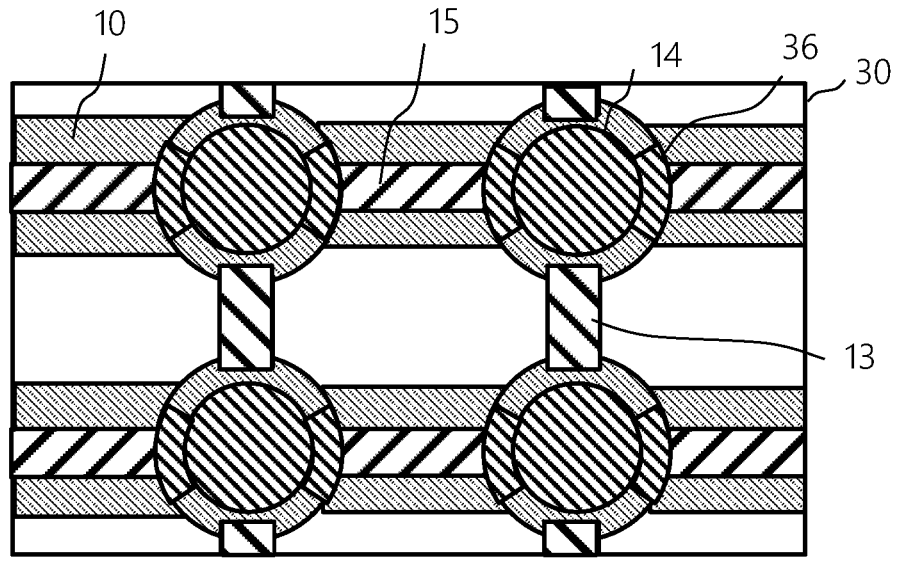
FIG. 70 is a top view showing another part of the steps of the method for fabricating the semiconductor device according to the first embodiment.
Figure 71:
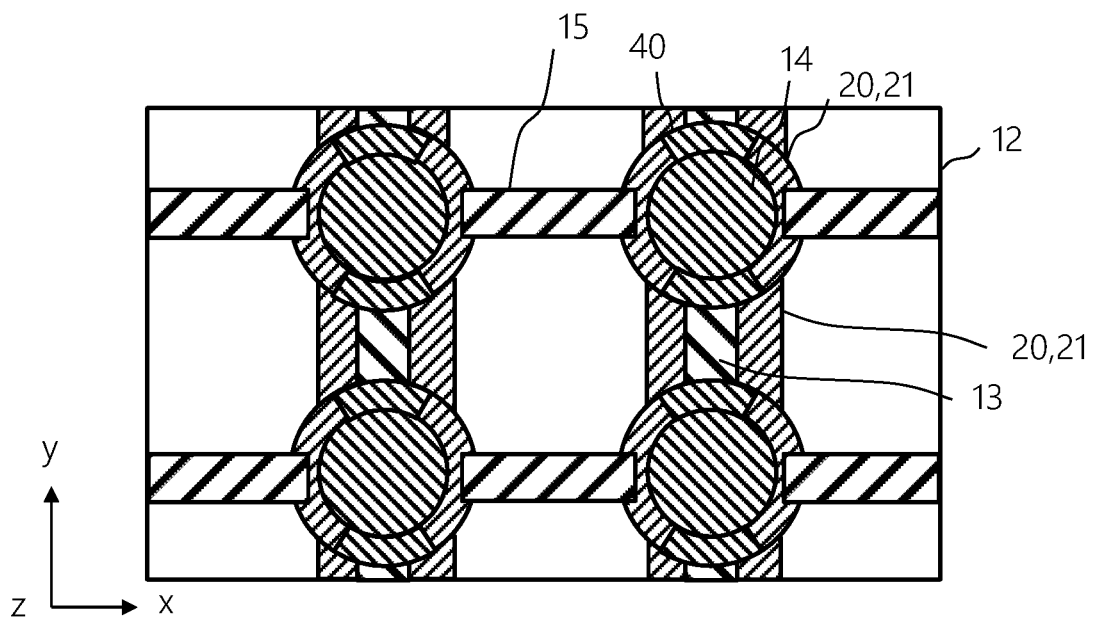
FIG. 71 is a top view showing another part of the steps of the method for fabricating the semiconductor device according to the first embodiment.
Figure 72:
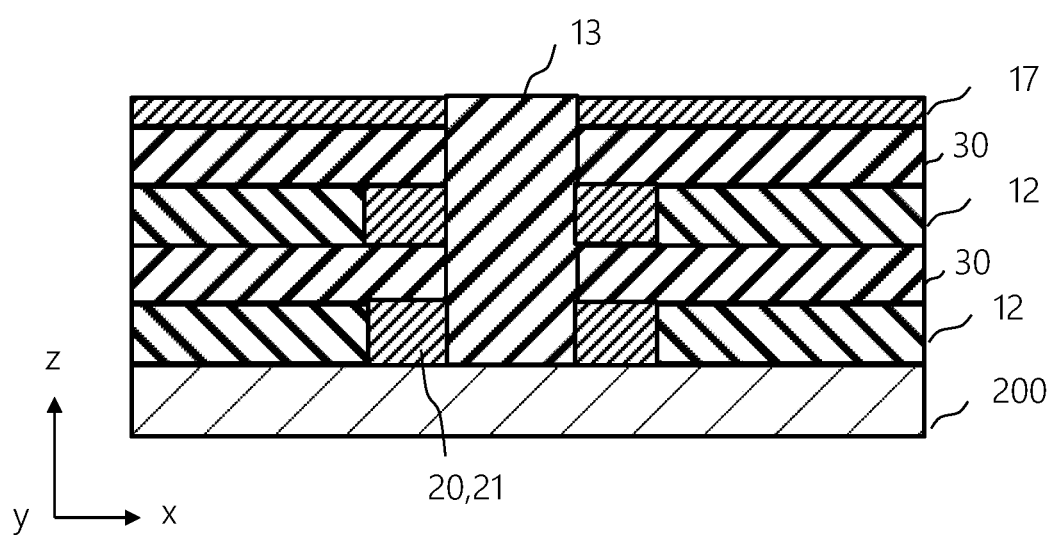
FIG. 72 is a cross-sectional view showing another part of the steps of the method for fabricating the semiconductor device according to the first embodiment.

FIG. 70 is a top view showing another part of the steps of the method for fabricating the semiconductor device according to the first embodiment. FIG. 71 is a top view showing another part of the steps of the method for fabricating the semiconductor device according to the first embodiment. FIG. 72 is a cross-sectional view showing another part of the steps of the method for fabricating the semiconductor device according to the first embodiment. FIGS. 70 to 72 show the dielectric film embedding step (S156) in FIG. 7. FIG. 70 is a top view of the nitride film layer 30. FIG. 71 is a top view of the oxide film layer 12. FIG. 72 shows a cross section in which the position of the groove 160 is viewed in the y direction (the same position as the I portion in FIG. 59).

In FIGS. 70 to 72, as the dielectric film embedding step (S156), the dielectric film 13 is embedded in the groove 160 by a CVD method. As a material of the dielectric film, for example $SiO_2$ is preferably used. As a result, as shown in FIGS. 71 and 72, the space between the two conductive layers 21 (and the memory film 20) forming a pair in a same plane can be filled with the dielectric film 13. In addition, as shown in FIGS. 70 and 72, the groove 160 of the nitride film layer 30 is also filled with the dielectric film 13 in the same manner.

Here, as shown in FIG. 70, the dielectric film 15 abuts on the growth film 36 in the nitride film layer 30. As shown in FIG. 71, the dielectric film 15 abuts on the arc-shaped portion of the memory film 20 in the oxide film layer 12. On the other hand, as shown in FIG. 70, the dielectric film 13 abuts on the arc-shaped portion of the conductive layer 10 in the nitride film layer 30. As shown in FIG. 71, the dielectric film 13 abuts on the growth film 40 in the oxide film layer 12. When the growth film 36 and the growth film 40 are stacked and viewed from above (z direction), a memory cell is formed in each of the four arc-shaped regions between the growth film 36 and the growth film 40 in the circumferential region along the outer edge of the columnar body 14. In other words, a memory cell is formed in each of the four arc-shaped regions where the growth film 36 and the growth film 40 are not formed in the circumferential region along the outer edge of the columnar body 14.

In the manner described above, the memory device shown in FIGS. 1 to 6 can be formed.

According to the first embodiment as described above, it is possible to improve the degree of integration of cells in a three-dimensional memory device.

The embodiment has been described above with reference to specific examples. The present disclosure is not limited to these specific examples. For example, in the example described above, the configuration of the memory film 20 for a flash memory device has been described. In the case of other memory devices, the memory film 20 for each memory device is arranged. For example, in the case of a ferroelectric memory device, a ferroelectric film is arranged as the memory film 20.

In addition, as for the film thickness of each film, the size, shape, number, and the like of the opening, those required in a semiconductor integrated circuit and various semiconductor elements can be appropriately selected and used.

In addition, all semiconductor devices that include the elements of the present disclosure and can be appropriately changed in design by those skilled in the art and methods for fabricating the same are included in the scope of the present disclosure.

In addition, for the sake of simplicity of description, methods commonly used in the semiconductor industry, for example, a photolithography process, cleaning before and after processing, and the like are omitted, and it goes without saying that these methods can be included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
   a columnar body;
   a first conductive layer extending in a plate shape in a first direction intersecting a direction in which the columnar body extends and extending along a first edge portion corresponding to a part of an outer edge of the columnar body;
   a second conductive layer extending in a plate shape in a second direction intersecting the direction in which the columnar body extends and the first direction and extending along the first edge portion of the columnar body; and
   a first memory film arranged in such a manner as to be sandwiched between the first conductive layer and the second conductive layer in the direction in which the columnar body extends in a region along the first edge portion of the columnar body where the first conductive layer and the second conductive layer intersect.

2. The semiconductor device according to claim 1, further comprising a third conductive layer arranged apart from the first conductive layer in a same plane that the first conductive layer exists, the third conductive layer extending in a plate shape in the first direction and extending along a second edge portion corresponding to another part of the outer edge of the columnar body,
   wherein the second conductive layer further extends along the second edge portion of the columnar body, and
   the first memory film is further arranged in such a manner as to be sandwiched between the third conductive layer and the second conductive layer in the direction in which the columnar body extends in a region along the second edge portion of the columnar body where the third conductive layer and the second conductive layer intersect.

3. The semiconductor device according to claim 2, wherein the first conductive layer further extends along a third edge portion corresponding to another part of the outer edge of the columnar body,
   the device further comprising:
   a fourth conductive layer arranged apart from the second conductive layer in a same plane that the second conductive layer exists, the fourth conductive layer extending in a plate shape in the second direction and extending along the third edge portion of the columnar body; and
   a second memory film arranged in such a manner as to be sandwiched between the first conductive layer and the fourth conductive layer in the direction in which the columnar body extends in a region along the third edge portion of the columnar body where the first conductive layer and the fourth conductive layer intersect.

4. The semiconductor device according to claim 3, wherein the third conductive layer further extends along a fourth edge portion corresponding to another part of the outer edge of the columnar body,
   the fourth conductive layer further extends along the fourth edge portion of the columnar body, and
   the second memory film is further arranged in such a manner as to be sandwiched between the third conductive layer and the fourth conductive layer in the direction in which the columnar body extends in a region along the fourth edge portion of the columnar body where the third conductive layer and the fourth conductive layer intersect.

5. The semiconductor device according to claim 1, wherein at least one of a metal material and a semiconductor material is used as a material of the second conductive layer.

6. The semiconductor device according to claim 1, wherein the second conductive layer is a channel layer.

7. The semiconductor device according to claim 1, wherein the first memory film is arranged in such a manner as to surround the second conductive layer in the region along the first edge portion of the columnar body where the first conductive layer and the second conductive layer intersect.

8. The semiconductor device according to claim 3, wherein the second memory film is arranged in such a manner as to surround the fourth conductive layer in the region along the third edge portion of the columnar body where the first conductive layer and the fourth conductive layer intersect.

9. The semiconductor device according to claim 1, wherein the first memory film is arranged on an upper face side, a lower face side, and a side of one of both side faces of the second conductive layer in a region where the second conductive layer extends in a plate shape in the second direction without extending along the outer edge of the columnar body.

10. The semiconductor device according to claim 3, wherein the second memory film is arranged on an upper face side, a lower face side, and a side of one of both side faces of the fourth conductive layer in a region where the fourth conductive layer extends in a plate shape in the second direction without extending along the outer edge of the columnar body.

11. The semiconductor device according to claim 3, wherein the first memory film is arranged on a side face opposite to the fourth conductive layer and not arranged on a side face on a side of the fourth conductive layer of both side faces of the second conductive layer, in a region where the second conductive layer extends in a plate shape in the second direction without extending along the outer edge of the columnar body.

12. The semiconductor device according to claim 11, wherein the second memory film is arranged on a side face opposite to the second conductive layer and not arranged on a side face on a side of the second conductive layer of both side faces of the fourth conductive layer, in a region where the fourth conductive layer extends in a plate shape in the second direction without extending along the outer edge of the columnar body.

* * * * *